US012757636B2

(12) United States Patent
Midorikawa et al.

(10) Patent No.: US 12,757,636 B2
(45) Date of Patent: Oct. 6, 2026

(54) PIEZOELECTRIC ELEMENT, METHOD FOR MANUFACTURING PIEZOELECTRIC ELEMENT, AND LIQUID EJECTION HEAD

(71) Applicant: CANON KABUSHIKI KAISHA, Tokyo (JP)

(72) Inventors: Chihiro Midorikawa, Kanagawa (JP); Youichi Fukaya, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 98 days.

(21) Appl. No.: 18/805,807

(22) Filed: Aug. 15, 2024

(65) Prior Publication Data

US 2025/0072291 A1 Feb. 27, 2025

(30) Foreign Application Priority Data

Aug. 25, 2023 (JP) ................................ 2023-137544

(51) Int. Cl.

*H10N 30/00* (2023.01)
*B41J 2/045* (2006.01)
*H10N 30/076* (2023.01)
*H10N 30/077* (2023.01)
*H10N 30/082* (2023.01)
*H10N 30/87* (2023.01)
*H10N 30/88* (2023.01)

(52) U.S. Cl.

CPC ........ *H10N 30/704* (2024.05); *B41J 2/04581* (2013.01); *H10N 30/076* (2023.02); *H10N 30/077* (2023.02); *H10N 30/082* (2023.02); *H10N 30/871* (2023.02); *H10N 30/883* (2023.02)

(58) Field of Classification Search

CPC .... H10N 30/082; H10N 30/704; H10N 30/06; H10N 30/077; H10N 30/87; H10N 30/076; H03H 3/02; B41J 2/1642; B41J 2/1646; B41J 2/1628; B41J 2/1629

See application file for complete search history.

(56) References Cited

U.S. PATENT DOCUMENTS

2008/0086860 A1* 4/2008 Fujii .................. B81C 1/00476 29/25.35
2012/0236081 A1* 9/2012 Nakayama ......... H10N 30/2047 347/68
2013/0229464 A1* 9/2013 Nawano ................ B41J 2/1645 29/25.35

(Continued)

FOREIGN PATENT DOCUMENTS

JP 2016-174022 A 9/2016

*Primary Examiner* — John P Zimmermann
(74) *Attorney, Agent, or Firm* — Venable LLP

(57) ABSTRACT

Provided is a piezoelectric element that includes a substrate having a lower electrode, a piezoelectric film, and an upper electrode, in that order, and an insulating film that covers at least a side surface of the piezoelectric film, wherein one of the side surfaces of the piezoelectric film has a plurality of step portions, each of the plurality of step portions has a first side surface and a second side surface, an angle of inclination of the first side surface with respect to an upper surface of the substrate is different from an angle of inclination of the second side surface with respect to the upper surface of the substrate, and an angle between the first side surface and the second side surface is 90° or more.

11 Claims, 21 Drawing Sheets

(56) References Cited

U.S. PATENT DOCUMENTS

| | | | | |
|---|---|---|---|---|
| 2014/0090473 | A1* | 4/2014 | Schneider | A61B 5/1172 73/632 |
| 2018/0076381 | A1 | 3/2018 | Furuya et al. | |
| 2022/0123715 | A1* | 4/2022 | Martin | H03H 9/02102 |
| 2023/0243710 | A1* | 8/2023 | Jomori | H04R 17/02 73/702 |
| 2023/0264474 | A1* | 8/2023 | Kurokawa | B41J 2/1623 |

* cited by examiner

PIEZOELECTRIC ELEMENT, METHOD FOR MANUFACTURING PIEZOELECTRIC ELEMENT, AND LIQUID EJECTION HEAD

BACKGROUND

Field

The present disclosure relates to a piezoelectric element, a method for manufacturing the piezoelectric element, and a liquid ejection head.

Description of the Related Art

A piezoelectric body, the shape of which changes when an electric field is applied, is used in a variety of industrial products as means of moving or vibrating an object minutely and precisely. For example, the piezoelectric body is used in a small speaker, a hard disk drive, a printer (liquid ejection apparatus), and the like. Among these, some printers employ a piezoelectric element as an element that generates energy to eject a droplet from a liquid ejection head. In such a liquid ejection head, a piezoelectric element is formed by electrodes (upper electrode, lower electrode) formed to pinch a piezoelectric film from above and below. By applying an electric field to the electrodes of this piezoelectric element, the piezoelectric element is driven and droplets are ejected. In this case, voltage required to sufficiently displace the piezoelectric element is several tens of volts, and it is necessary to apply a relatively high voltage as a semiconductor device. For this reason, almost the entire surface of the piezoelectric element generally used in a liquid ejection head is covered with an insulating film that has favorable dielectric strength. However, such an insulating film may peel off during a manufacturing process after a step of forming the insulating film or during driving of a piezoelectric layer. Therefore, in Japanese Patent Application Publication No. 2016-174022, a method has been proposed in which a piezoelectric layer is patterned by wet etching to make a side surface of the piezoelectric layer uneven, thereby increasing a contact area between the piezoelectric layer and an organic insulating layer, thereby suppressing peeling of an insulating film.

In the method described in Japanese Patent Application Publication No. 2016-174022, a piezoelectric film is formed by stacking a plurality of precursor layers by repeating formation of a precursor layer and the crystallization of the precursor layer multiple times using a sol-gel method. When this piezoelectric film is wet-etched, unevenness is formed on the side surface of the piezoelectric layer due to a difference in etching rate caused by a difference in composition ratio within each precursor layer. In the method described in Japanese Patent Application Publication No. 2016-174022, a depressed portion on the side surface is a groove portion formed perpendicular to a film thickness direction of the piezoelectric layer and parallel to a lamination interface of the precursor layer.

Like the piezoelectric film shape described in Japanese Patent Application Publication No. 2016-174022, it is possible to increase a surface area by forming a plurality of groove portions on the side surface of the piezoelectric layer, but on the other hand, such an approach becomes a factor that reduces coverage of the insulating film in a subsequent insulating film formation process. At the time of study by the present inventors, a gap was formed at a bottom portion of a groove on a side surface of a piezoelectric layer where an insulating film was not formed, which could cause peeling of the insulation, cracking, or the like.

SUMMARY

The present disclosure provides a piezoelectric element with excellent coverage of an insulating film covering the piezoelectric element.

The present disclosure is a piezoelectric element comprising:

- a substrate having a lower electrode, a piezoelectric film, and an upper electrode, in that order; and
- an insulating film that covers at least a side surface of the piezoelectric film, wherein
- one of the side surfaces of the piezoelectric film has a plurality of step portions,
- each of the plurality of step portions has a first side surface and a second side surface,
- an angle of inclination of the first side surface with respect to an upper surface of the substrate is different from an angle of inclination of the second side surface with respect to the upper surface of the substrate, and
- an angle between the first side surface and the second side surface is 90° or more.

Further features of the present disclosure will become apparent from the following description of exemplary embodiments with reference to the attached drawings.

DESCRIPTION OF THE EMBODIMENTS

Hereinafter, examples of the present disclosure will be described with reference to the drawings. The examples described below are intended to illustrate examples of embodiments of the present disclosure, and are not intended to limit the scope of the present disclosure. Dimensions, shapes, numbers, materials, and the like of various members in the following examples can be changed as appropriate within the scope of the present disclosure unless otherwise specified.

The present disclosure suppresses peeling and destruction of a piezoelectric element, particularly an insulating film covering a side surface thereof, by forming the side surface of the piezoelectric element in a stepped shape. Here, the piezoelectric element includes a piezoelectric film, a lower electrode, and an upper electrode formed in a direction perpendicular to a film surface. Further, a piezoelectric element provided with an insulating film, an upper electrode pad, a sealing film, and a sealing film depressed portion is also called a piezoelectric element for simplicity. In the following description, a long side direction (longitudinal direction) of the piezoelectric element is an X direction, a short side direction (short side direction) is a Y direction, and a thickness direction (film thickness direction) is a Z direction. The X direction, Y direction, and Z direction are orthogonal to each other.

Figure 1A:
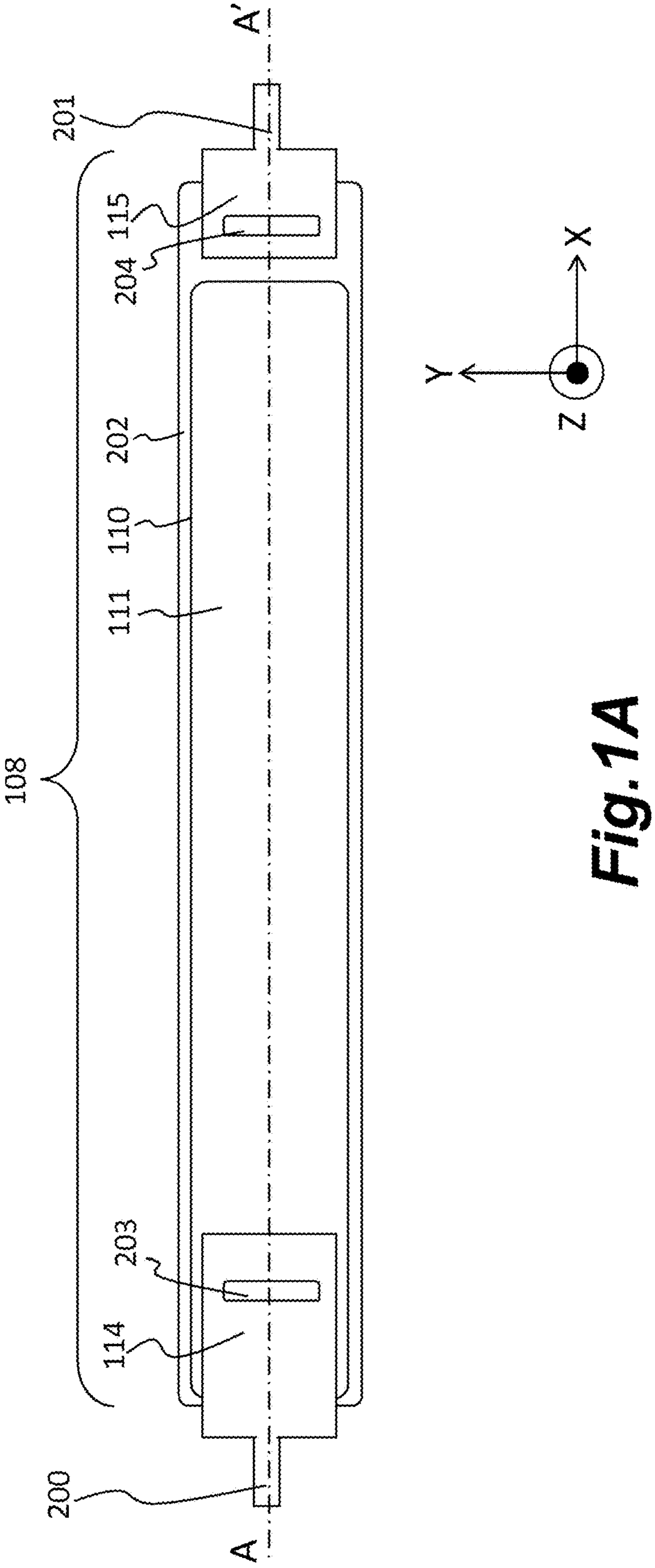
FIG. 1A is a schematic diagram for illustrating a structure of an example of a piezoelectric element according to an example.
Figure 1B:
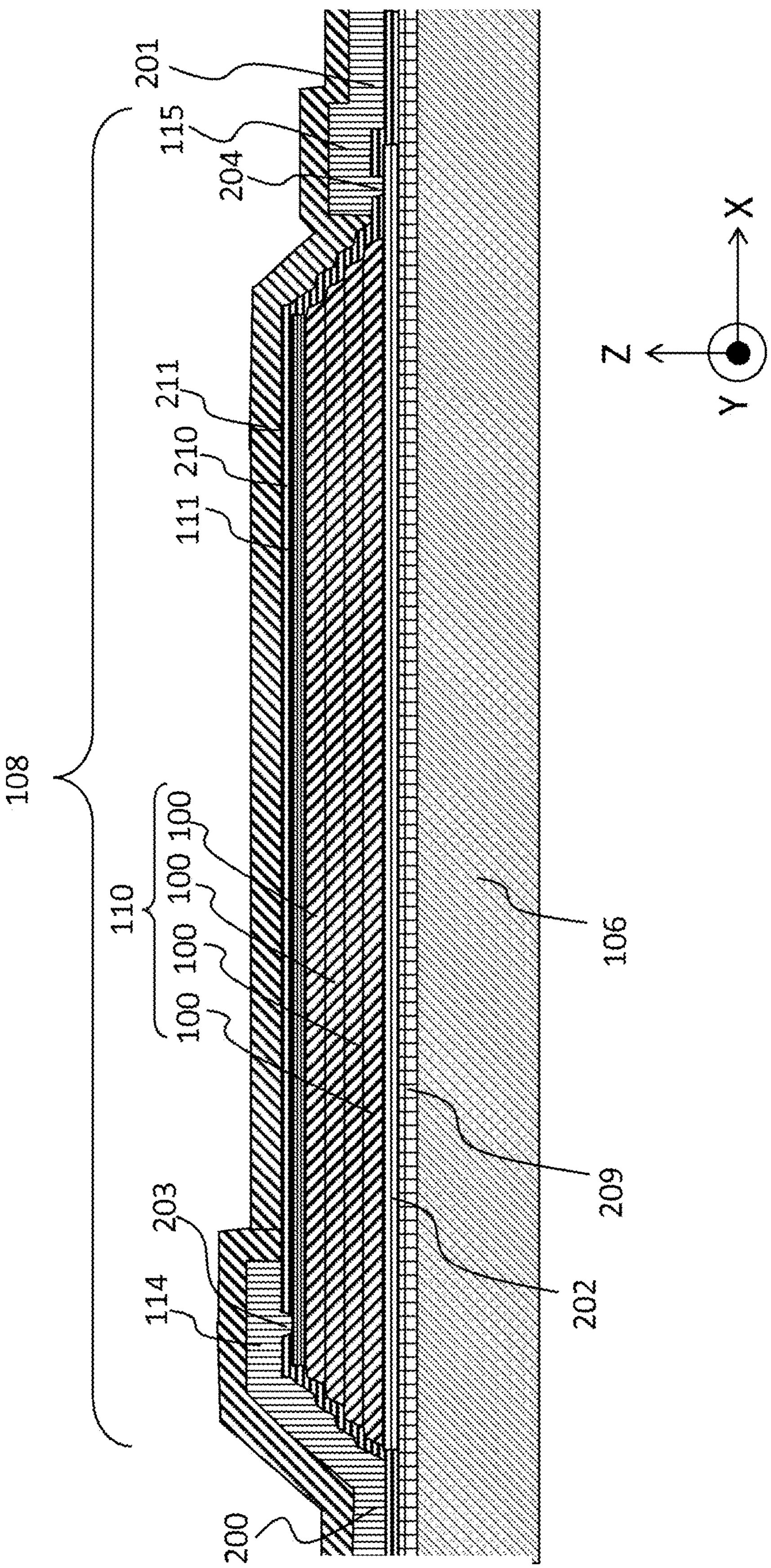
FIG. 1B is a schematic diagram for illustrating the structure of the example of the piezoelectric element according to the example.

FIG. 1A illustrates a top view of a piezoelectric element 108 in the example, and FIG. 1B illustrates a cross-sectional view taken along line A-A' in FIG. 1A. The piezoelectric element 108 includes, in this order, a lower electrode 202 provided on an upper surface of a substrate 106, a piezoelectric film 110 formed on an upper surface of the lower electrode 202, and an upper electrode 111 formed on an upper surface of the piezoelectric film 110. Further, the piezoelectric element 108 includes an insulating film 210 that covers a portion of the upper surface of the lower electrode 202 where the piezoelectric film 110 is not formed, a portion of the upper surface of the piezoelectric film 110 where the upper electrode 111 is not formed, an upper surface of the upper electrode 111, and a side surface of the piezoelectric film 110. The piezoelectric element 108 is provided with a signal wiring 200 for supplying an operation signal and a common wiring 201 for supplying a common potential. An upper electrode pad 114 is arranged at an end of the piezoelectric element 108 in an X direction, and is electrically connected to the signal wiring 200 and the upper electrode 111 of the piezoelectric element 108. Further, near an end of the piezoelectric element 108 on an opposite side in the X direction with respect to the upper electrode pad 114, there is an extended region of the lower electrode 202, and a lower electrode pad 115 is arranged in an upper layer thereof. The lower electrode pad 115 is electrically connected to the common wiring 201 and the lower electrode 202.

The substrate 106 is selected from silicon nitride film, silicon, metal, heat-resistant glass, and the like depending on required mechanical properties, reliability, and the like. In this example, a silicon wafer is used as the substrate 106, and a silicon oxide film is formed as an insulating film 209 on a surface of the substrate 106 on which the lower electrode 202 is formed.

The lower electrode 202 may be exposed to temperatures as high as several hundred degrees Celsius during a process after formation, and in such cases it is preferable to use a material with a high melting temperature. Examples include copper, platinum, gold, chromium, cobalt, titanium, and alloys thereof. Further, when the piezoelectric film 110 is formed in contact with an upper surface of the lower electrode 202, the lower electrode 202 may also serve as a film that controls a crystal orientation of the piezoelectric film. In that case, the material to be used is appropriately selected from one having an appropriate crystalline structure. For example, when the material of the piezoelectric film 110 is lead zirconate titanate, it is preferable to use platinum for the lower electrode 202 as the crystal orientation control film.

As the piezoelectric film 110, lead zirconate titanate is used in this example because it is easy to obtain a large amount of displacement. However, other piezoelectric materials can also be used, such as barium titanate, lead titanate, lead metaniobate, bismuth titanate, zinc oxide, aluminum nitride, potassium sodium niobate, and the like. Further, in this example, the piezoelectric film 110 is formed by laminating a plurality of piezoelectric layers 100.

Figure 2:
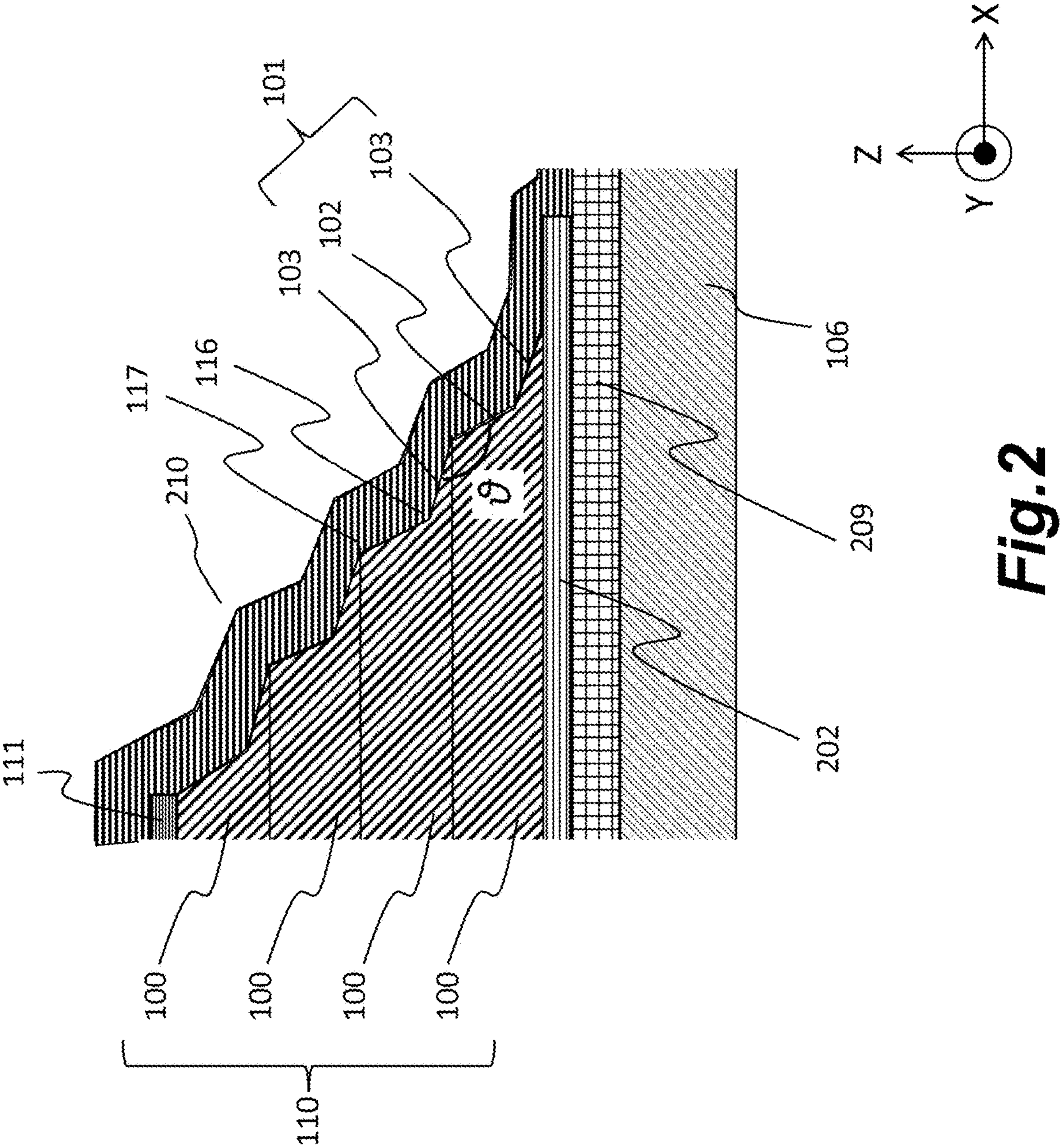
FIG. 2 is a schematic diagram for illustrating the structure of the example of the piezoelectric element of the example.

As illustrated in FIG. 1B, a width of the piezoelectric film 110 in a direction (X direction) perpendicular to a film thickness direction (Z direction) monotonically increases from the upper electrode 111 to the lower electrode 202 (in a −Z direction). As illustrated in FIG. 2, a side surface of the piezoelectric film 110 is shaped like a step consisting of a plurality of step portions 101. Each of the plurality of step portions 101 has a first side surface 102 and a second side surface 103. The first side surface 102 and the second side surface 103 have different inclination angles with respect to a plane (the upper surface of the substrate 106) parallel to a direction (XY direction) in which the piezoelectric layer 100 extends. An angle θ formed by the first side surface 102 and the second side surface 103 is 90° or more.

An angle of inclination of the second side surface 103 with respect to the upper surface of the substrate 106 is smaller than an angle of inclination of the first side surface 102 with respect to the upper surface of the substrate 106.

The step-like shape of the side surface of the piezoelectric film 110 is formed by alternately repeating step portions 116 having a concave shape and step portions 117 having a convex shape. The step portion 116 having a concave shape is formed by the second side surface 103 and the first side surface 102 connected to an upper end of the second side surface 103. The step portion 117 having a convex shape is formed by the first side surface 102 and the second side surface 103 connected to an upper end of the first side surface 102. An angle between the first side surface 102 and the second side surface 103 in the step portion 116 having a concave shape and an angle between the first side surface 102 and the second side surface 103 in the step portion 117 having a convex shape are both 90° or more. As a result, a width of the piezoelectric film 110 in the X direction continues to widen from the upper electrode 111 toward the lower electrode 202. Each of the plurality of step portions 101 forming the stepped side surface corresponds to each of the plurality of piezoelectric layers 100 forming the piezoelectric film 110. One step portion 101 consists of a first side surface 102 and a second side surface 103.

The upper electrode 111 may be made of any material that is electrically conductive, and may be made of materials commonly used as electrode materials, such as aluminum, copper, tungsten, titanium, chromium, gold, and platinum. However, when an internal stress of the lower electrode 202 or the like is large and causes the piezoelectric film 110 to bend, the upper electrode 111 may be given an opposite internal stress to offset the stress of the entire element. Such materials include, for example, alloys of titanium and tungsten.

For the insulating film 210, common insulating materials such as silica, silicon nitride, oxynitride, and alumina can be used. Further, a laminated film made of two or more types of materials selected from these materials may be used. Since the piezoelectric element 108 is driven by generally applying a high voltage of 30 V or more, the material and film thickness of the insulating film 210 are selected in consideration of the breakdown electric field strength.

The piezoelectric element 108 expands and contracts when a high voltage is applied. When the adhesiveness between the insulating film 210 and the piezoelectric film 110 is not sufficient, peeling and destruction may occur when the film is expanded and contracted. The side surface of the piezoelectric film 110 of this example has a stepped shape. Therefore, a contact area between the piezoelectric film 110 and the insulating film 210 is large, and the adhesiveness between the insulating film 210 and the piezoelectric film 110 is good. Therefore, peeling and destruction are less likely to occur.

Figure 3:
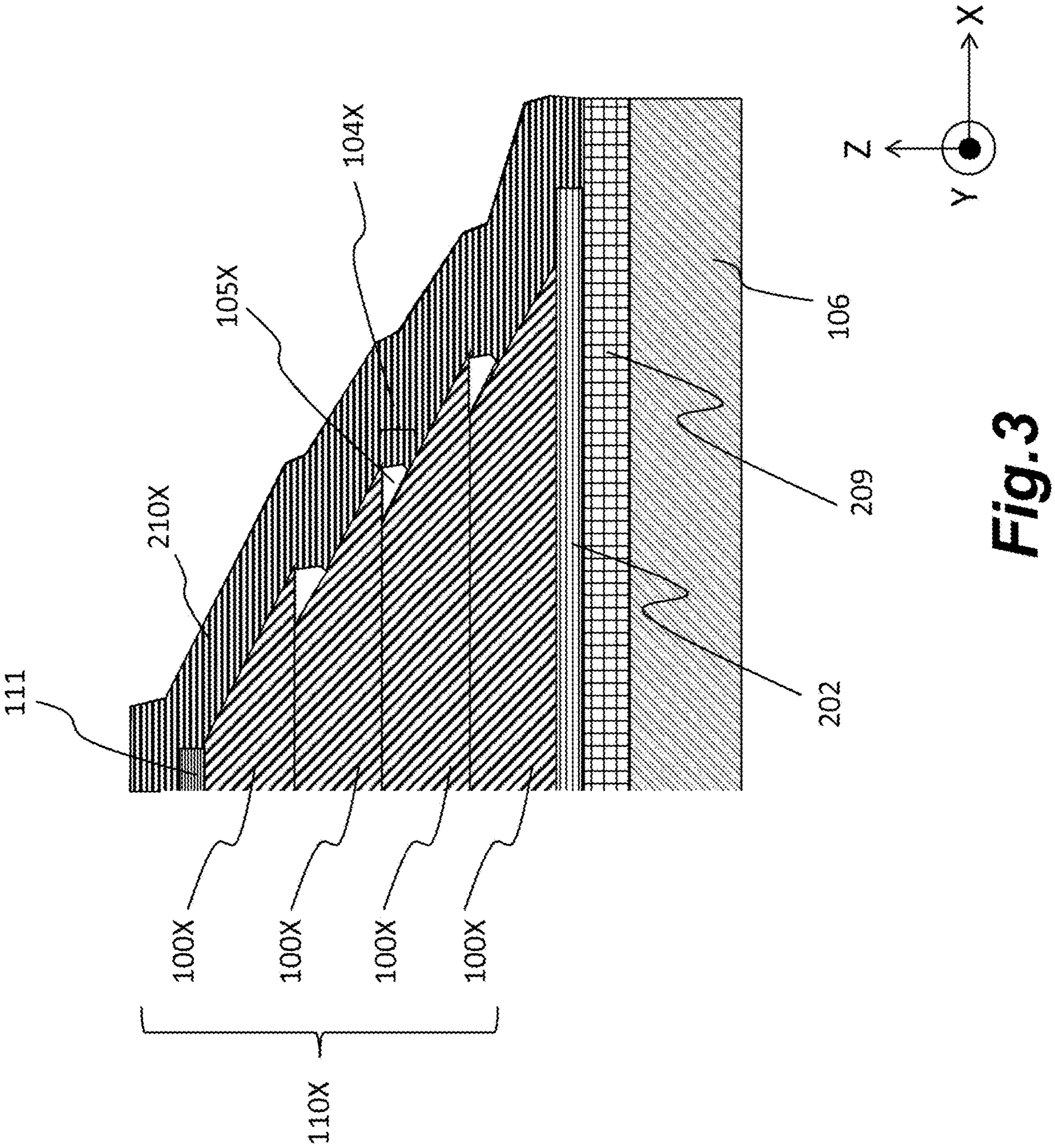
FIG. 3 is a schematic diagram for illustrating a structure of an example of a piezoelectric element of a comparative example.

Here, a piezoelectric element as a comparative example will be described with reference to FIG. 3. In the comparative example, unevenness on a side surface of a piezoelectric film 110X is constituted by a groove portion 104X formed in a direction perpendicular to the film thickness direction (Z direction) of the piezoelectric film 110X and parallel to a lamination interface of a precursor layer. Also in the comparative example, a contact area between the piezoelectric film 110X and an insulating film 210X is large due to unevenness caused by the groove portion 104X. However, since the groove portion 104X becomes a shadow when the insulating film 210 is formed, a gap 105X is likely to be formed within the groove portion 104X. The gap 105X at a boundary between the insulating film 210X and the piezoelectric film 110X causes cracks to occur during subsequent manufacturing steps or when the piezoelectric element is driven.

On the other hand, in this example, the side surface of the piezoelectric film 110 has a stepped shape, as illustrated in FIG. 2, and the angle θ between the first side surface 102 and the second side surface 103 is 90° or more. With such a stepped shape, there is no shadow area when forming the insulating film 210, and the insulating film 210 and the piezoelectric film 110 can be brought into close contact with each other without any gaps.

An upper electrode contact portion 203 is opened at one end in the X direction of the piezoelectric element 108, and an upper electrode pad 114 connected to the signal wiring 200 is formed in an upper layer thereof. The upper electrode pad 114 and the upper electrode 111 are electrically connected via the upper electrode contact portion 203. Further, a lower electrode contact portion 204 is opened in the insulating film 210 on an extending region of the lower electrode 202 near the end opposite to the upper electrode pad 114 in the X direction. The lower electrode pad 115 connected to the common wiring 201 is formed on an upper layer of the lower electrode contact portion 204. The lower electrode pad 115 and the lower electrode 202 are electrically connected via the lower electrode contact portion 204. Further, a sealing film 211 is formed in an upper layer, and covers at least each wiring and each electrode pad.

Materials commonly used for electrical wiring can be used for the signal wiring 200 and the common wiring 201. For example, aluminum, copper, gold, or an alloy thereof. Further, a titanium or chromium film may be inserted to improve adhesiveness with an underlying layer. The piezoelectric element 108 is generally driven by applying a high voltage of 30 V or more at a high frequency of several hundred to several thousand Hz. Therefore, the wiring should have a high slew rate, such as by making the wiring film relatively thick.

The sealing film 211 covers the signal wiring 200 and the common wiring 201, as well as the upper electrode pad 114 and the lower electrode pad 115. For the sealing film 211, a material having both high insulation and coverage properties is used. For example, silica, silicon nitride, alumina, and the like having high insulating properties are preferably used. This can prevent current from flowing through a device surface and causing failure in a humid environment. According to the piezoelectric element 108 of this example described above, peeling of the insulating layer and occurrence of cracks can be suppressed.

Example 1

Figure 4A:
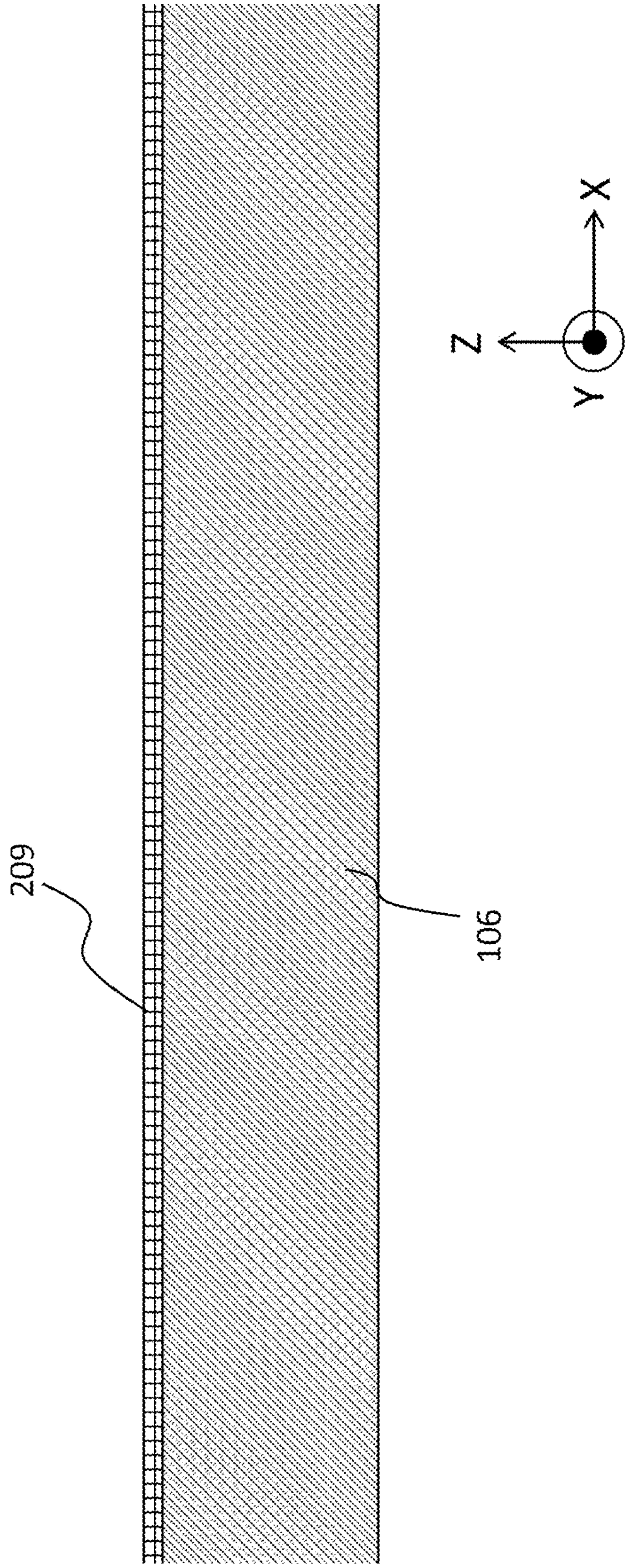
FIG. 4A is a schematic diagram illustrating a method for manufacturing a piezoelectric element according to an example.

A method for manufacturing a piezoelectric element in an example 1 will be described using FIGS. 4A to 4I. As illustrated in FIG. 4A, a substrate 106 which is a silicon wafer was prepared, and a silicon thermal oxide film of about 500 nm was formed on the upper surface of the substrate 106 by a wet oxidation method in which a silicon thermal oxide film was formed using oxygen and hydrogen gas, thereby forming an insulating film 209.

Figure 4B:
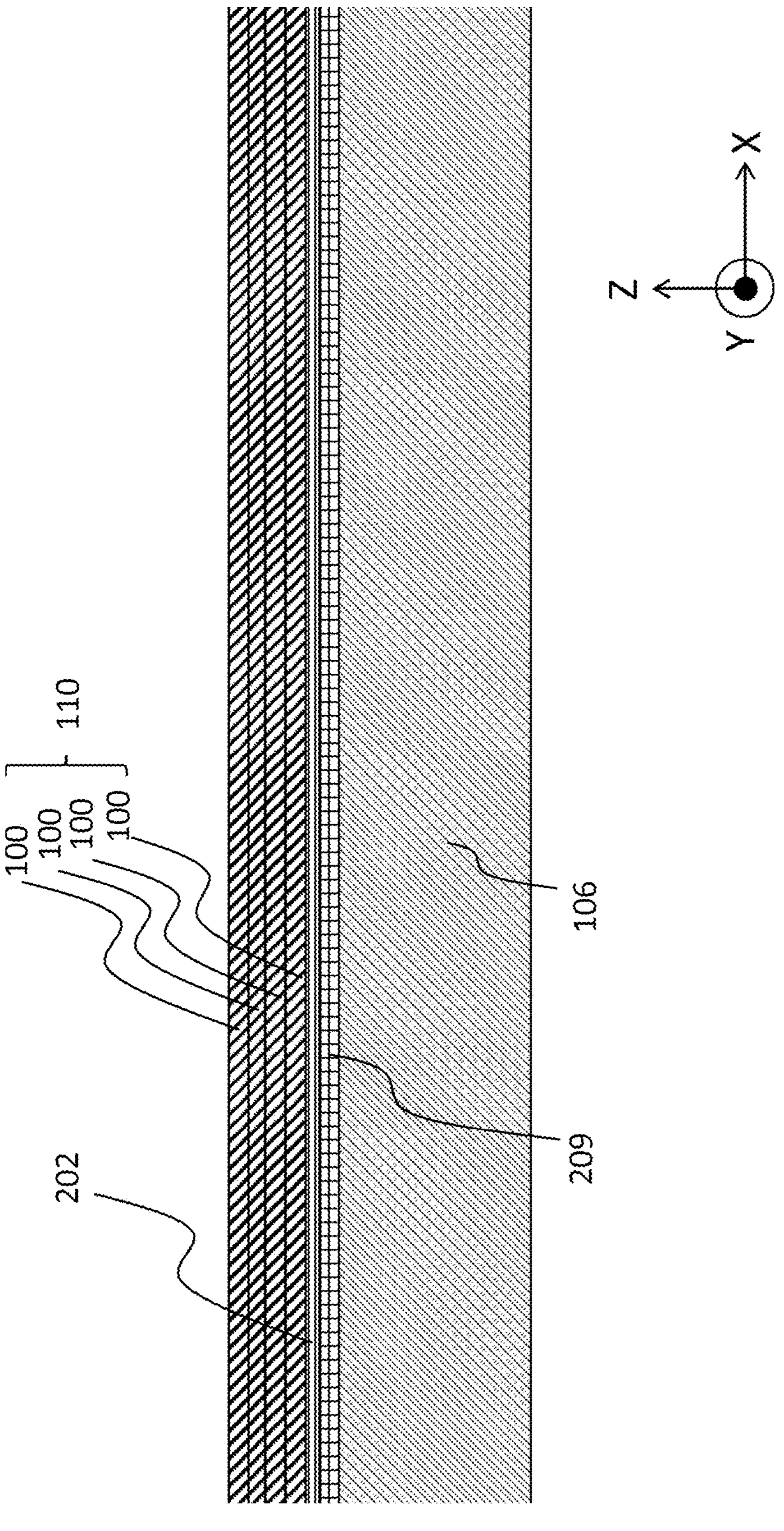
FIG. 4B is a schematic diagram illustrating the method for manufacturing the piezoelectric element according to the example.

Subsequently, as illustrated in FIG. 4B, a lower electrode 202 and a piezoelectric film 110 were sequentially formed on the upper surface of the substrate 106 on which the insulating film 209 was formed. As the lower electrode 202, a platinum film with a thickness of 90 nm to 110 nm was formed by sputtering. In order to obtain adhesion between the lower electrode 202 and the insulating film 209, titanium was formed as an adhesion layer with a thickness of 5 nm to 15 nm (not illustrated). A lead zirconate titanate layer serving as a piezoelectric layer 100 was formed on the lower electrode 202 by a liquid phase method (sol-gel method) so as to have a (100) orientation. Further, by forming the piezoelectric layer 100 multiple times, the piezoelectric film 110 with a thickness of 1.9 μm to 2.1 μm was formed.

Figure 4C:
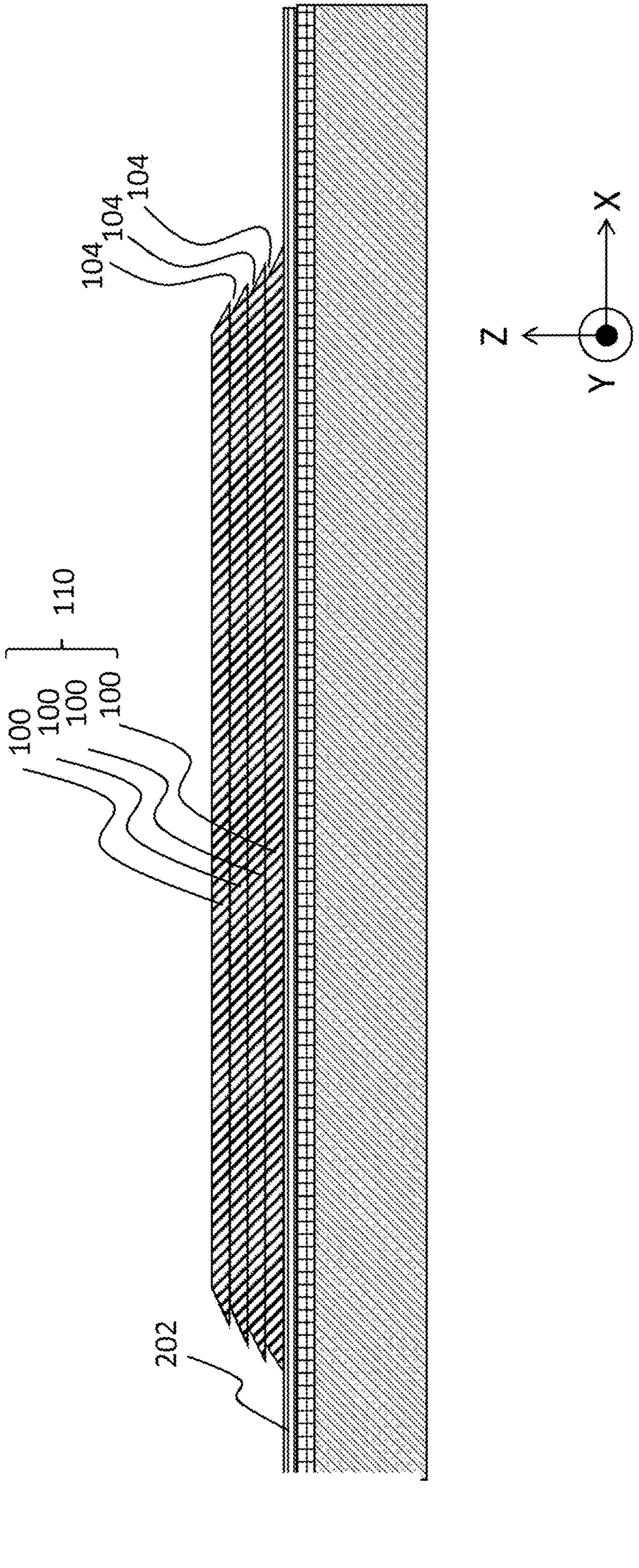
FIG. 4C is a schematic diagram illustrating the method for manufacturing the piezoelectric element according to the example.

Subsequently, as illustrated in FIG. 4C, a resist pattern (not illustrated) was formed by photolithography so that the piezoelectric film 110 has a desired pattern, and then the piezoelectric film 110 was patterned by wet etching. Pure Etch PT204 manufactured by Hayashi Pure Chemical Industries was used as the etchant. When the piezoelectric film 110 of lead zirconate titanate laminated by the sol-gel method was wet-etched, a groove portion 104 that is concave in a direction parallel to a laminated surface of the piezoelectric layer 100 was formed on a side surface of the piezoelectric film 110, as illustrated in FIG. 4C. This is because each of the piezoelectric layers 100 formed by the sol-gel method tends to be rich in lead titanate on the lower electrode 202 side and rich in lead zirconate on the opposite side. Since an etching rate of lead titanate is lower than an etching rate of lead zirconate, the groove portion 104 is formed which is concave in a direction parallel to the laminated surface of the piezoelectric layer 100 as illustrated in FIG. 4C.

Figure 4D:
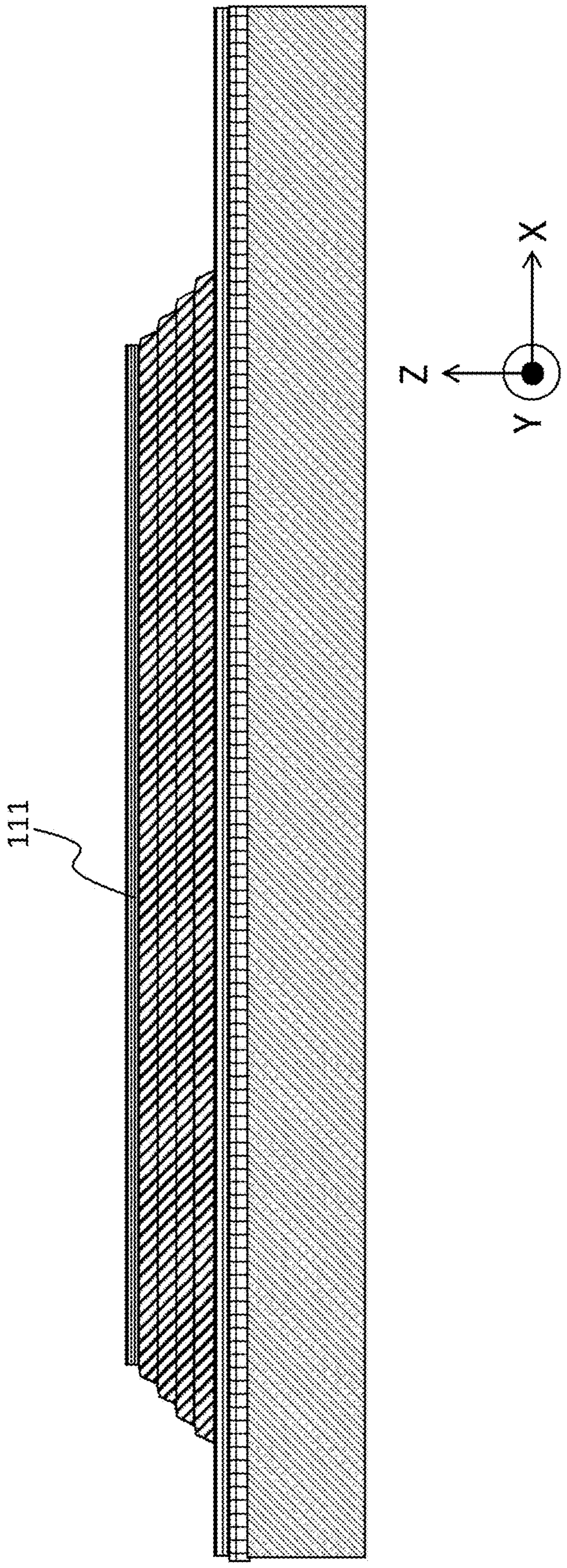
FIG. 4D is a schematic diagram illustrating the method for manufacturing the piezoelectric element according to the example.

Subsequently, as illustrated in FIG. 4D, an upper electrode 111 was formed on the piezoelectric film 110 by sputtering. As the material of the upper electrode 111, an alloy of titanium and tungsten was used, and the film thickness was set to 90 nm to 110 nm. Next, a resist pattern (not illustrated) was formed by photolithography so that the upper electrode 111 has a desired pattern, and then patterning was performed by dry etching.

Figure 5A:
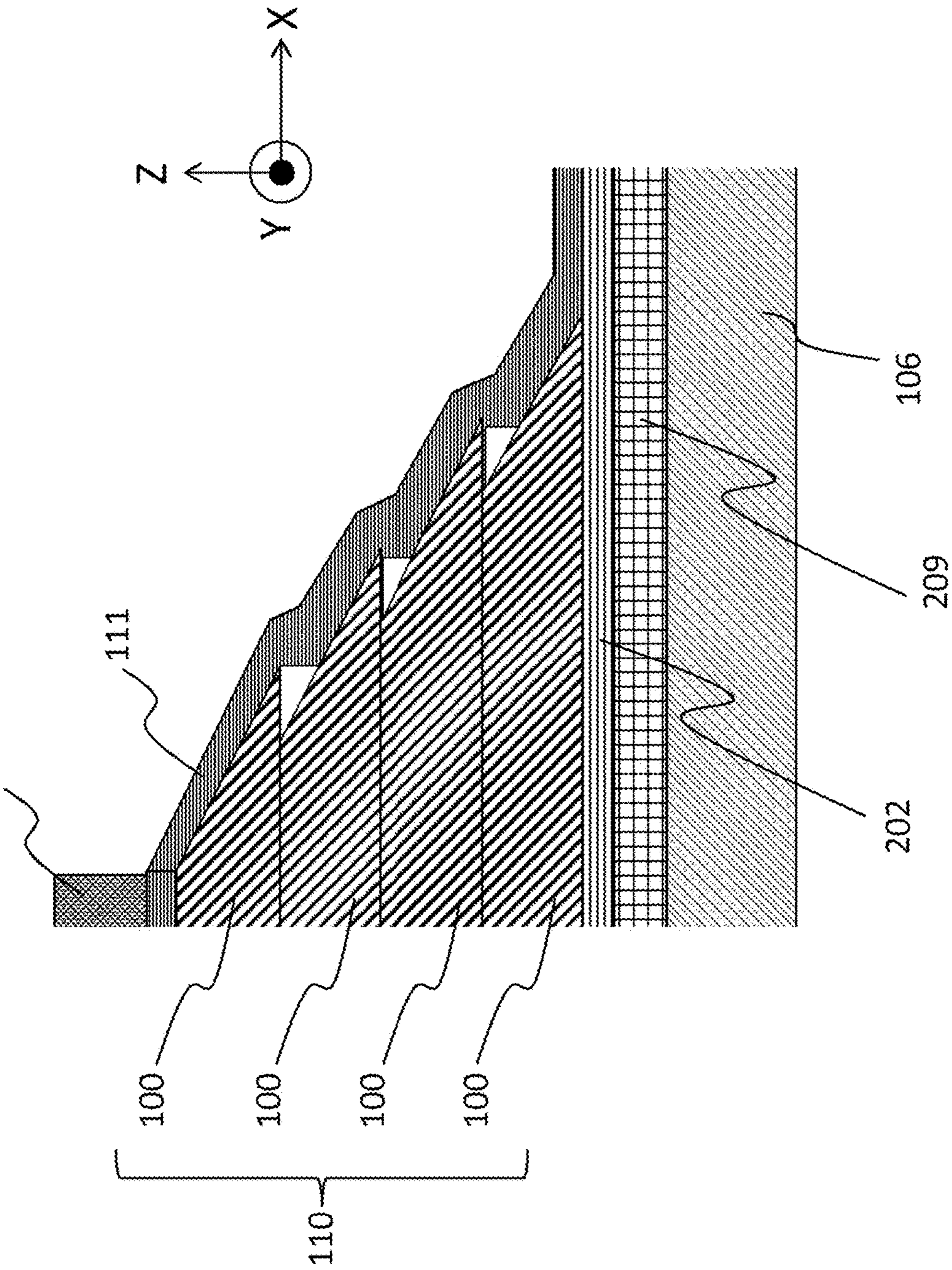
FIG. 5A is a schematic diagram illustrating a method for manufacturing a piezoelectric element according to an example 1.
Figure 5B:
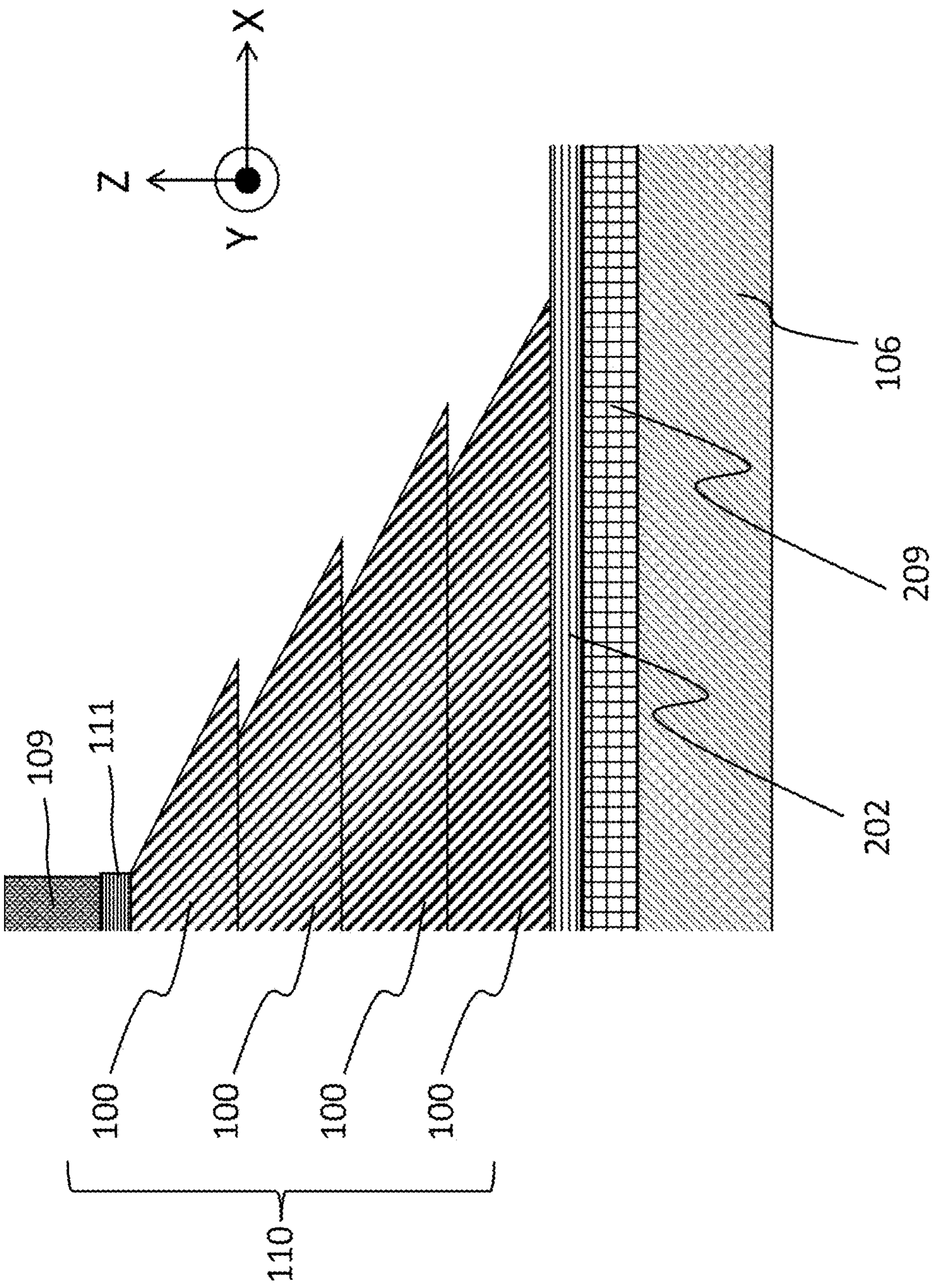
FIG. 5B is a schematic diagram illustrating the method for manufacturing the piezoelectric element according to the example 1.
Figure 5C:
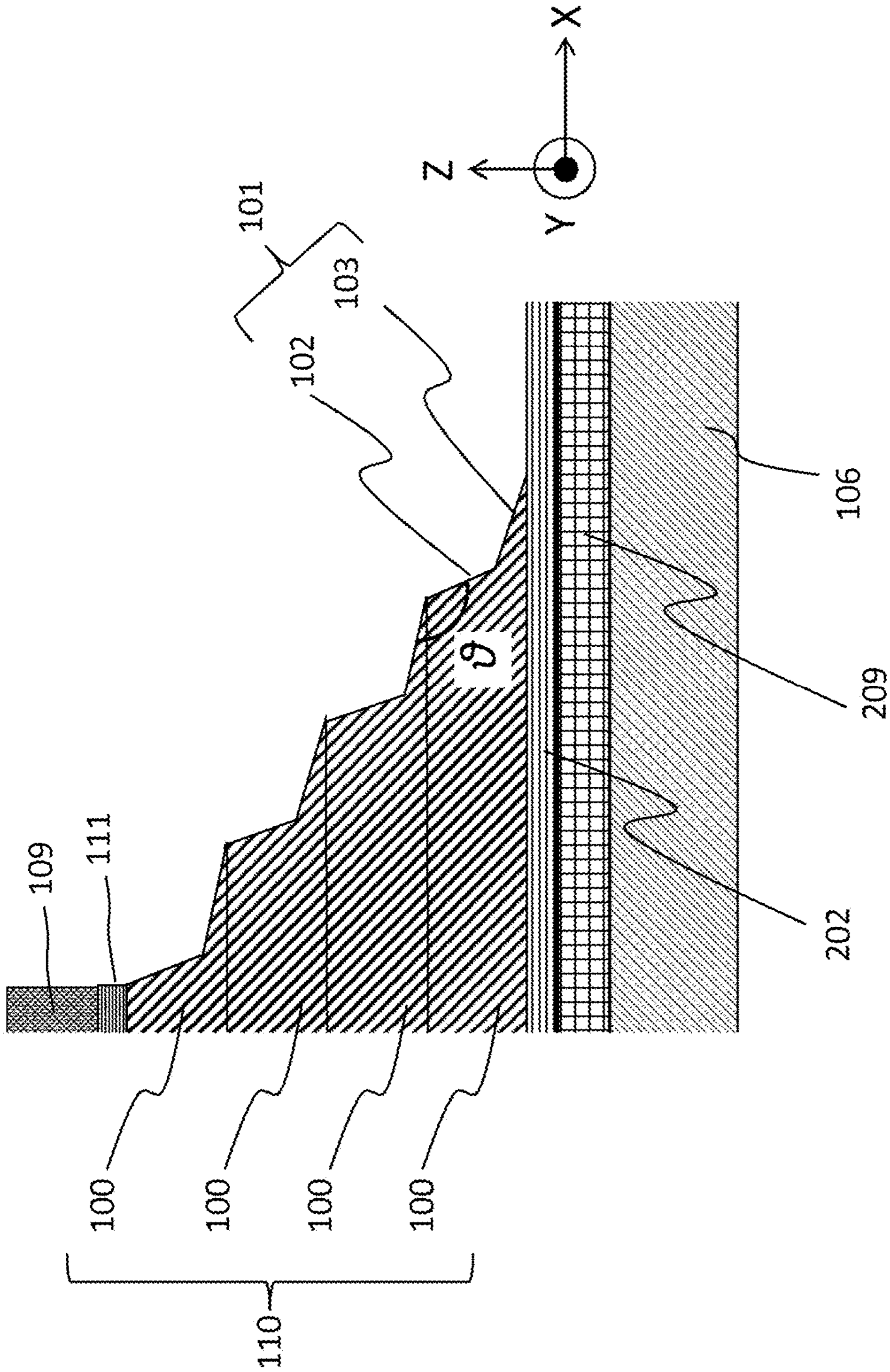
FIG. 5C is a schematic diagram illustrating the method for manufacturing the piezoelectric element according to the example 1.

This dry etching process will be described in detail with reference to FIGS. 5A to 5C. FIG. 5A illustrates a side view of the piezoelectric film 110 immediately after the upper electrode 111 was formed. As illustrated in FIG. 5A, first, a metal film that will become the upper electrode 111 was formed over an entire pattern formation surface of the substrate 106. The entire pattern formation surface of the substrate 106 is the entire surface of a member located above the substrate 106 (in a +Z direction) that is exposed upward. In FIG. 5A, the entire pattern formation surface includes an upper surface of a portion of each piezoelectric layer 100 of the piezoelectric film 110 where no other piezoelectric layer 100 is present above, and an upper surface of a portion of a lower electrode 202 where no piezoelectric film 110 is formed. A resist 109 is patterned on the piezoelectric film 110.

Next, in order to remove the upper electrode 111 formed on the side surface of the piezoelectric film 110, dry etching was performed using SF6 gas. As a result, the upper electrode 111 is formed on an upper surface of the piezoelectric film 110. A schematic side view of the piezoelectric film 110 after dry etching is shown in FIG. 5B.

Next, in order to process the side surface of the piezoelectric film 110, dry etching was performed using C4F8 gas. Here, processing is to arrange the shape of the side surface into the step-like shape described above. Regarding processing conditions, the pressure was 0.3 Pa, the antenna RF was 400 W, the bias RF was 150 W, and the processing time was 50 seconds (first processing time). A schematic side view of the piezoelectric film 110 after the processing is shown in FIG. 5C. The side surface of the piezoelectric film 110 has a stepped shape, and the angle θ between a first side surface 102 and a second side surface 103 was 100° to 140°.

Figure 4E:
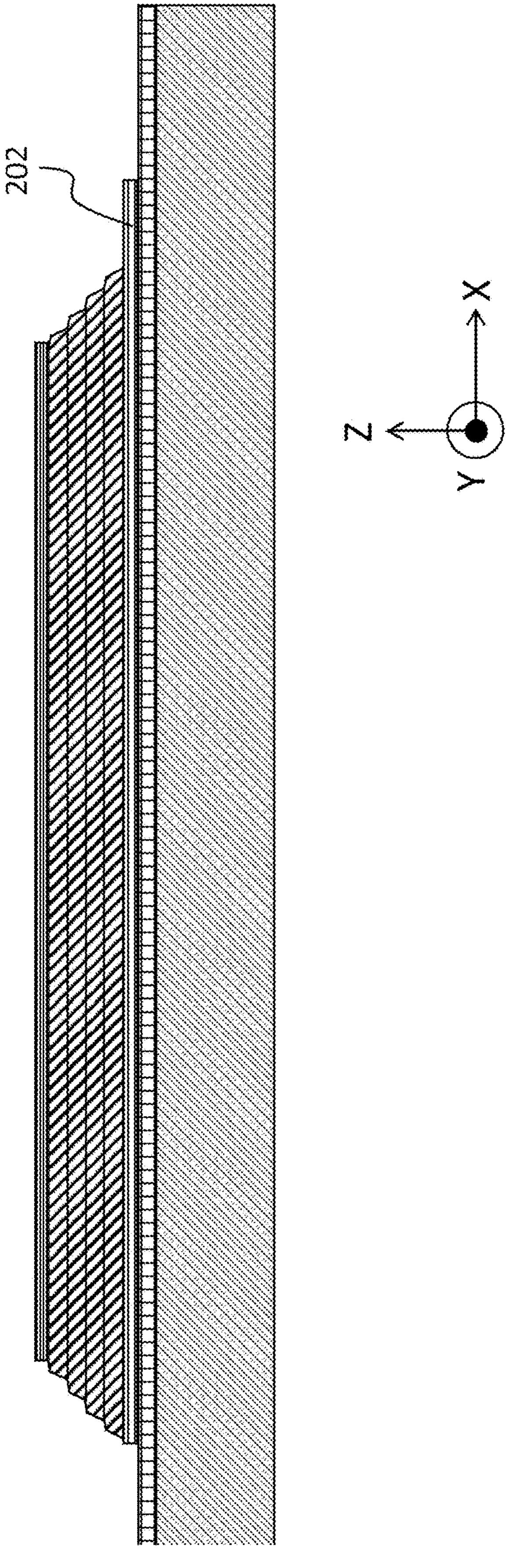
FIG. 4E is a schematic diagram illustrating the method for manufacturing the piezoelectric element according to the example.

Subsequently, as illustrated in FIG. 4E, a resist pattern (not illustrated) was formed again by photolithography so that the lower electrode 202 has a desired pattern, and then the lower electrode 202 was patterned by etching.

Figure 4F:
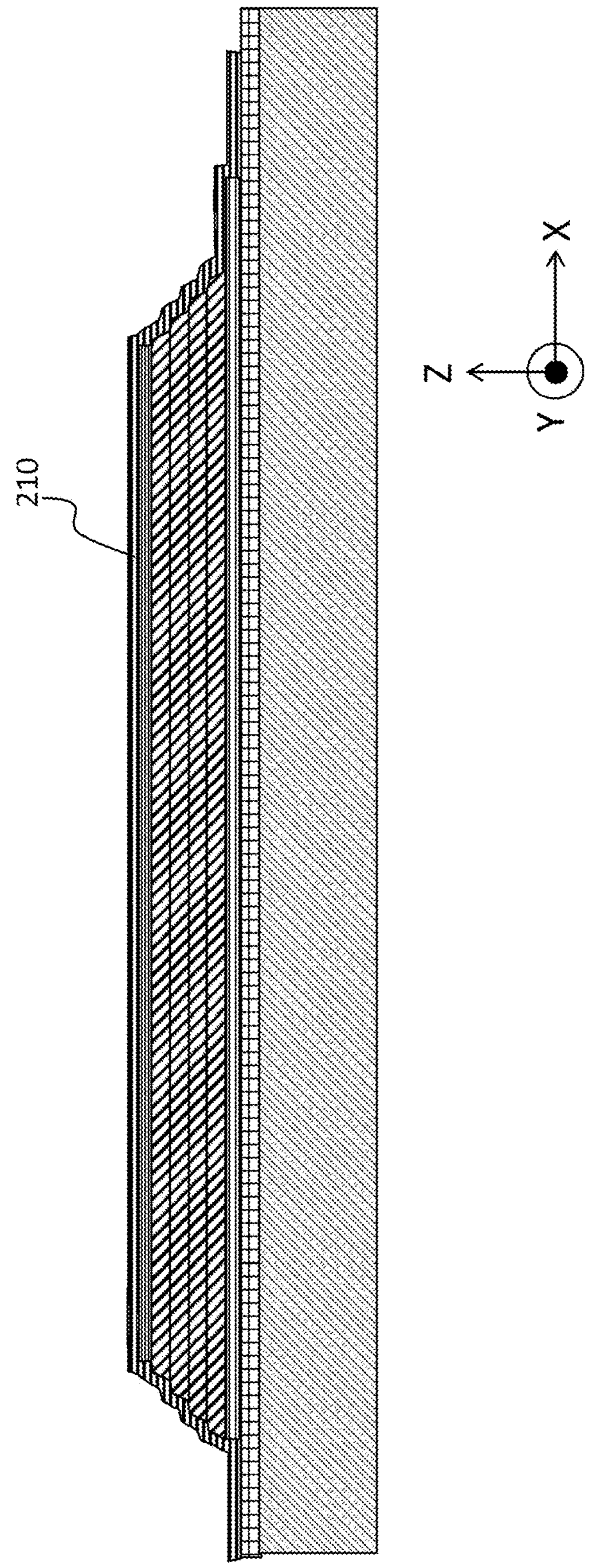
FIG. 4F is a schematic diagram illustrating the method for manufacturing the piezoelectric element according to the example.

Next, as illustrated in FIG. 4F, an insulating film 210 was formed on the entire pattern formation surface of the substrate 106. Although not particularly illustrated, in the example 1, the insulating film 210 has a laminated structure. First, an aluminum oxide film with a thickness of 20 nm to 30 nm was formed using the ALD method (atomic layer deposition method), and then a silicon oxide film with a thickness of 350 nm to 450 nm was formed using the CVD method (chemical vapor deposition method).

The insulating film 210 may be formed by a combination of the ALD method and the CVD method, or may be formed by only the CVD method.

Figure 4G:
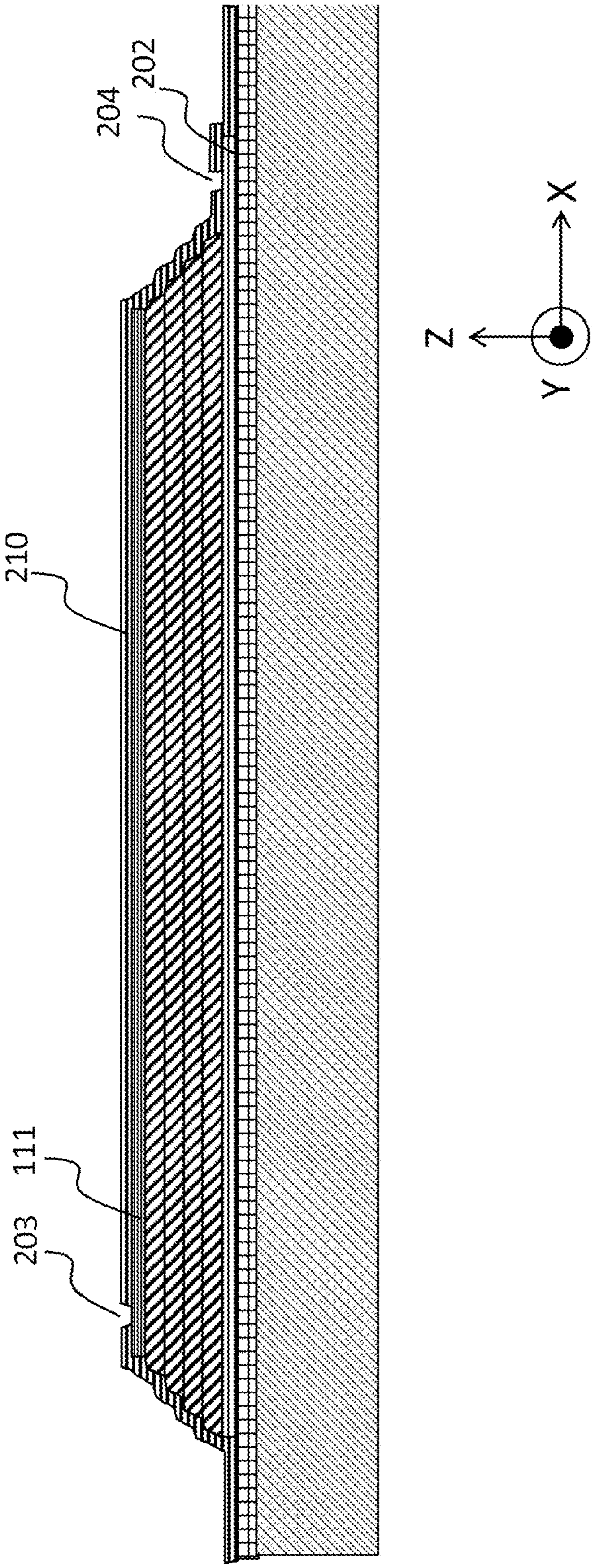
FIG. 4G is a schematic diagram illustrating the method for manufacturing the piezoelectric element according to the example.

Next, as illustrated in FIG. 4G, a resist pattern (not illustrated) was formed in the insulating film 210 by photolithography in order to form through holes to the upper electrode 111 and the lower electrode 202. Then, the upper electrode contact portion 203 and the lower electrode contact portion 204 were formed by etching.

Figure 4H:
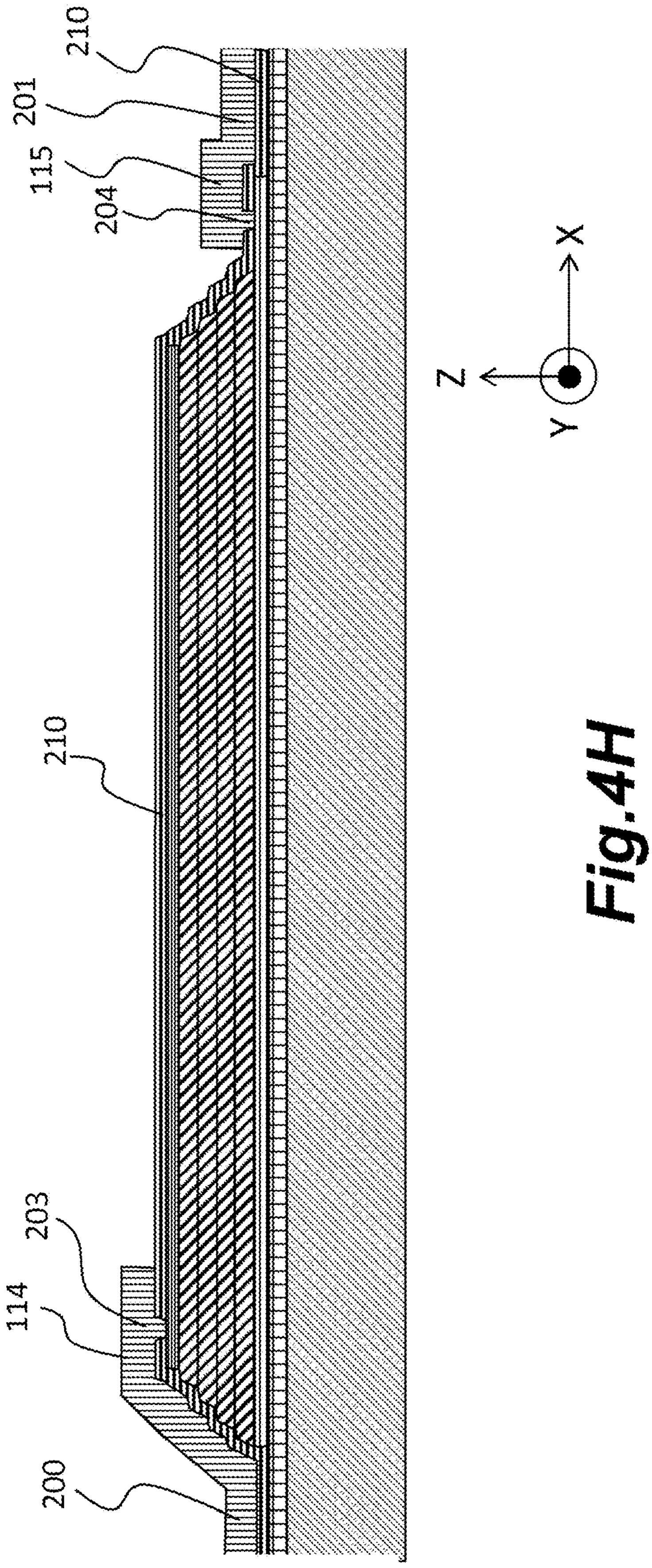
FIG. 4H is a schematic diagram illustrating the method for manufacturing the piezoelectric element according to the example.

Next, as illustrated in FIG. 4H, a wiring material was deposited on the insulating film 210 by sputtering. An alloy material of aluminum and copper was used as the wiring material, and its thickness was 500 nm to 700 nm. After forming a resist pattern (not illustrated) in a desired pattern by photolithography, a signal wiring 200 and a common wiring 201, as well as an upper electrode pad 114 and a lower electrode pad 115 were formed by etching.

Figure 4I:
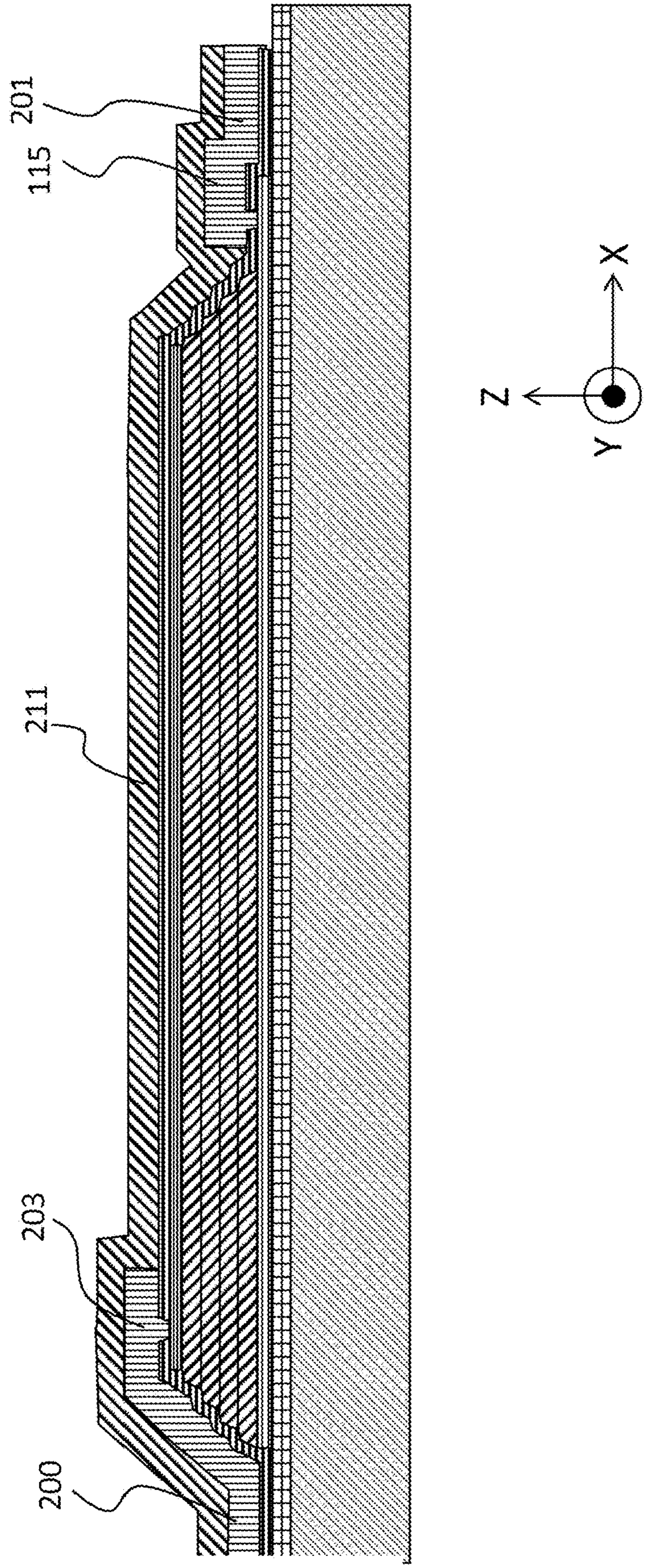
FIG. 4I is a schematic diagram illustrating the method for manufacturing the piezoelectric element according to the example.

Next, as illustrated in FIG. 4I, a sealing film 211 was formed to cover each wiring and each electrode pad. A silicon nitride film with high moisture resistance was used as the sealing film, and was deposited to a thickness of 150 nm to 250 nm using the CVD method. Although not illustrated, thereafter, by resist patterning and etching, openings are formed in the sealing film 211 above electrode terminals for applying a voltage for driving an actuator present at wiring ends of the signal wiring 200 and the common wiring 201.

The piezoelectric element 108 obtained in this way was subjected to a high temperature and high pressure bias test for the purpose of evaluating its durability. Specifically, under an environment of a temperature of 85° C., and a humidity of 85%, a DC voltage of 60 V was applied and maintained for 200 hours. Then, when the state of the piezoelectric element 108 was checked, no damage or peeling of the insulating film 210 was observed in the piezoelectric element 108, and it was confirmed that the piezoelectric element 108 remained in a normal state.

Example 2

Figure 6:
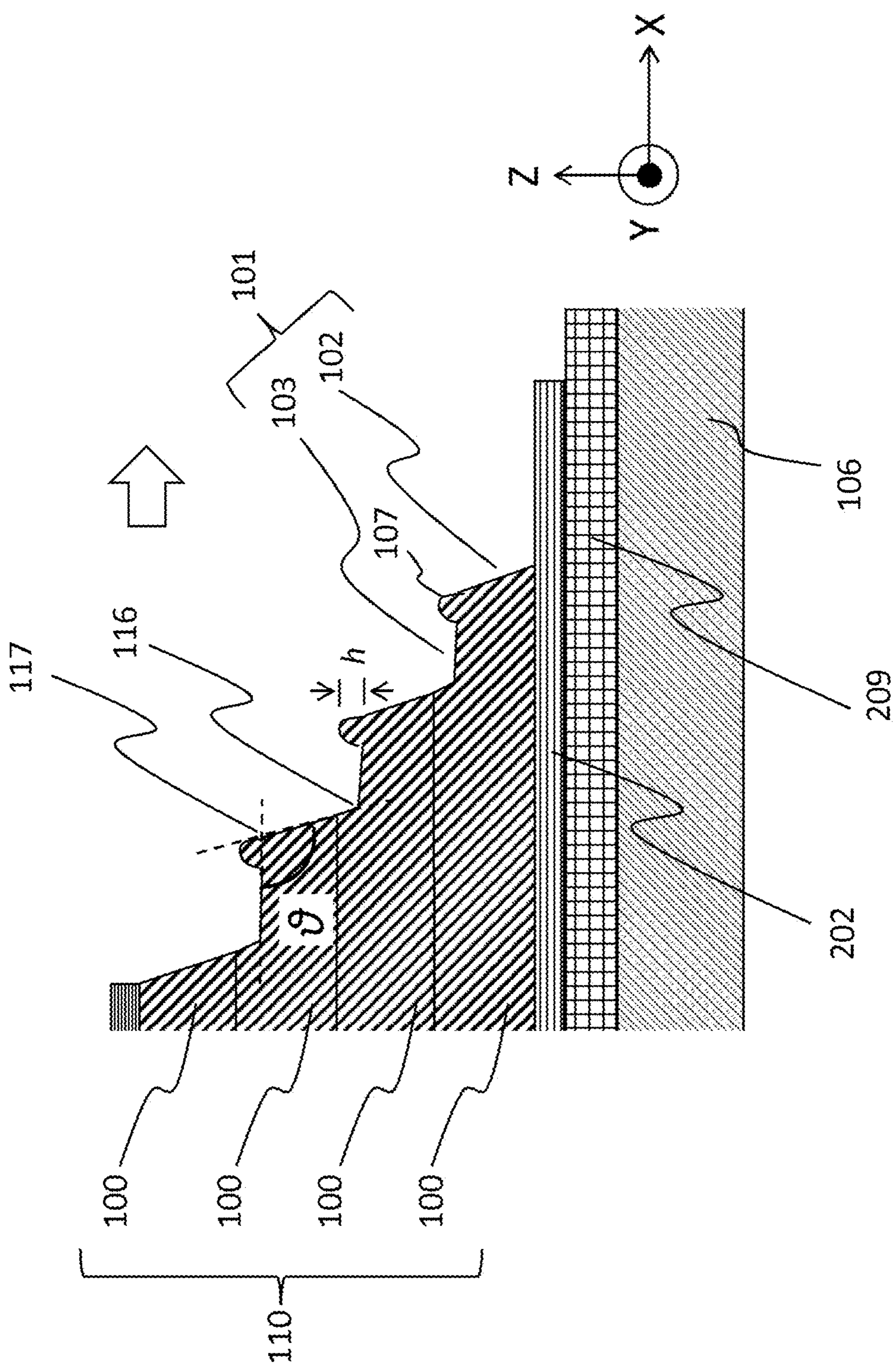
FIG. 6 is a schematic diagram for illustrating a structure of a piezoelectric element of an example 2.

FIG. 6 illustrates a side cross-sectional view of a piezoelectric film 110 of an example 2. In the example 2, as illustrated in FIG. 6, a side surface of the piezoelectric film 110 has a stepped shape consisting of a plurality of step portions 101. Each of the plurality of step portions 101 has a first side surface 102 and a second side surface 103. The first side surface 102 and the second side surface 103 have different inclination angles with respect to a plane (an upper surface of a substrate 106) parallel to the direction in which a piezoelectric layer 100 extends (XY direction). An angle θ formed by the first side surface 102 and the second side surface 103 is 90° or more.

The first side surface 102 forms an inclined portion inclined to the upper surface of the substrate 106, and the second side surface 103 forms a flat portion substantially parallel to the upper surface of the substrate 106. The second side surface 103 may not be parallel to the upper surface of the substrate 106 in a mathematically strict sense, but may be at an inclination angle within a range where it can be said to be substantially parallel.

The step-like shape of the side surface of the piezoelectric film 110 is formed by alternately repeating step portions 116 having a concave shape and step portions 117 having a convex shape. The step portion 116 having a concave shape is formed by a second side surface 103 and a first side surface 102 connected to an upper end of the second side surface 103. The step portion 117 having a convex shape is formed by a first side surface 102 and a second side surface 103 connected to an upper end of the first side surface 102. An angle between the first side surface 102 and the second side surface 103 in the step portion 116 having a concave shape and an angle between the first side surface 102 and the second side surface 103 in the step portion 117 having a convex shape are both 90° or more. As a result, a width of the piezoelectric film 110 in the X direction continues to widen from an upper electrode 111 toward a lower electrode 202.

Each of the plurality of step portions 101 forming the stepped side surface corresponds to each of the plurality of piezoelectric layers 100 forming the piezoelectric film 110. The side surface of one step portion 101 consists of a first side surface 102 and a second side surface 103. A protrusion 107 that protrudes in a film thickness direction (Z direction) is formed in the step portion 117 having a convex shape. Since the second side surface 103 is flat, a protruding direction of the protrusion 107 is substantially perpendicular to the second side surface 103.

The angle θ between the first side surface 102 and the second side surface 103 is defined as an angle formed by a straight line that is an imaginary extension of the first side surface 102 excluding the protrusion 107 and a straight line that is an imaginary extension of the second side surface 103 excluding the protrusion 107 in a cross section (cross section perpendicular to the Y direction) of FIG. 6.

In the piezoelectric element 108 of the example 2, due to the protrusion 107, a contact area between the piezoelectric film 110 and the insulating film 210 is larger than that of the example 1. Further, since the protrusion 107 acts as a stopper in a direction (a direction indicated by the arrow in FIG. 6, the X direction) of peeling of the insulating film 210, the peeling resistance can be further improved. However, when a height h of the protrusion 107 in the Z direction is too high, there is a possibility that an upper electrode pad 114 and a signal wiring 200 (both not illustrated) will be disconnected. Therefore, the height h of the protrusion 107 is preferably ⅕ or less of the thickness of the upper electrode pad 114 and the signal wiring 200. The height h of the protrusion 107 in the example 2 was 10 nm to 140 nm.

Figure 7A:
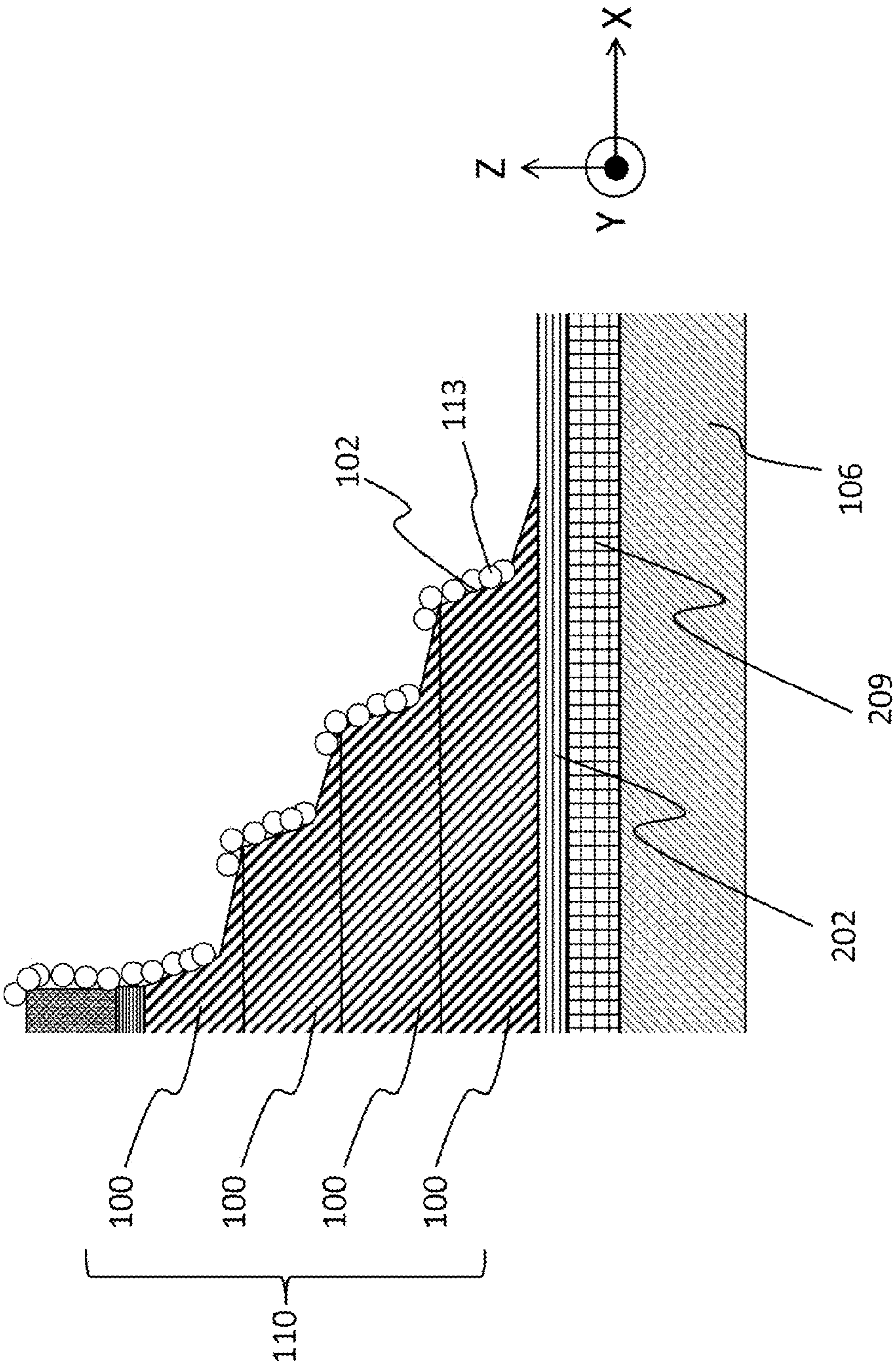
FIG. 7A is a schematic diagram illustrating a method for manufacturing the piezoelectric element according to the example 2.
Figure 7B:
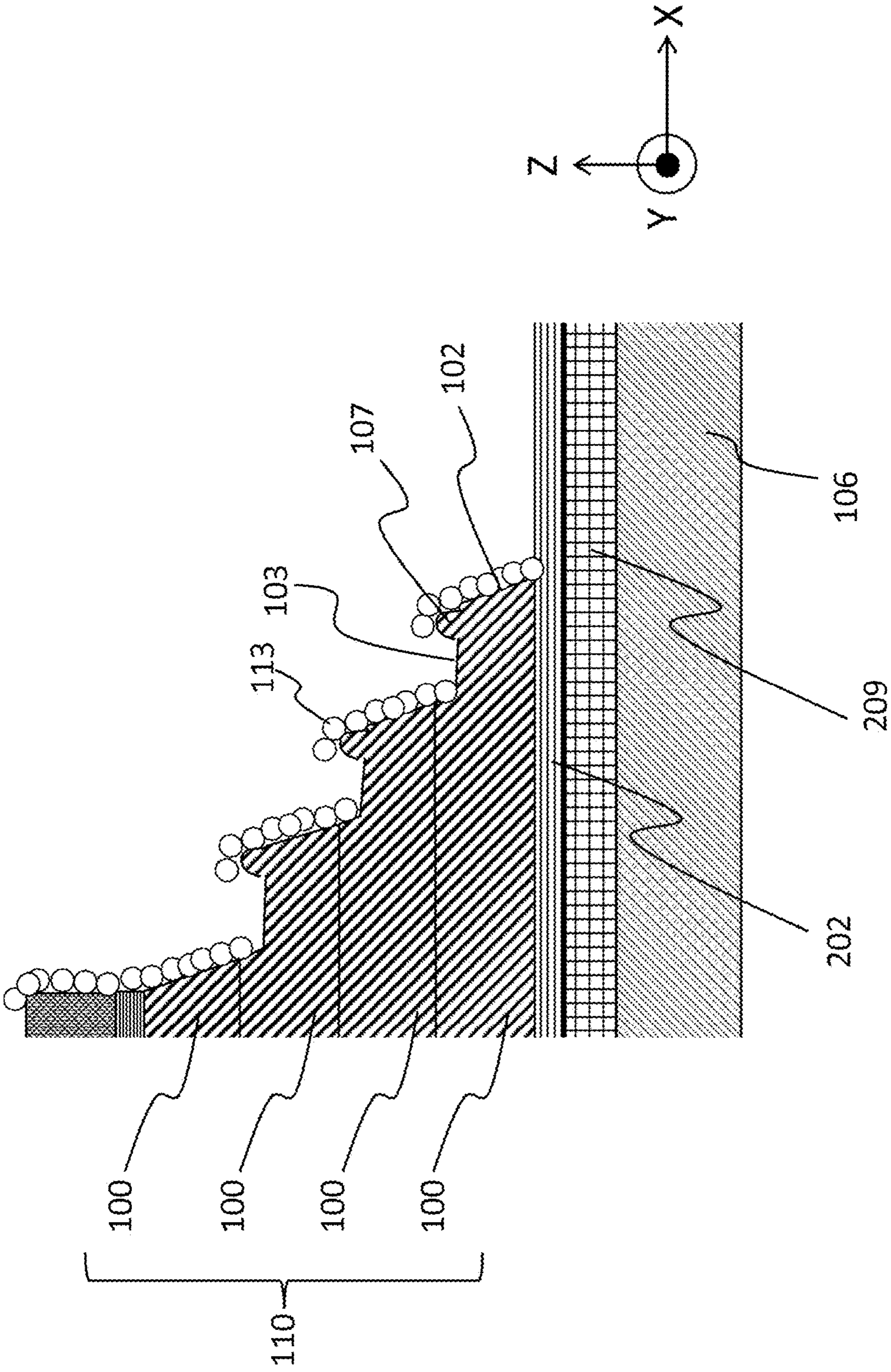
FIG. 7B is a schematic diagram illustrating the method for manufacturing the piezoelectric element according to the example 2.

The method for manufacturing the piezoelectric element 108 in the example 2 is the same as in the example 1 except for the step of processing the side surface of the piezoelectric film 110. Therefore, only the processing steps will be described. FIGS. 7A and 7B illustrate schematic diagrams of the steps of processing a side surface of the piezoelectric film 110 in the example 2. The processing conditions in the example 2 were a pressure of 0.3 Pa, an antenna RF of 400 W, a bias RF of 150 W, and a processing time of 200 seconds, which was longer than that of the example 1 (second processing time). As the processing proceeds, the first side surface 102 of the piezoelectric film 110 is covered with an etching deposit 113, as illustrated in FIG. 7A. Since the etching deposit 113 acts as an etching mask, when processing is further performed, the protrusion 107 is formed near an intersection of the second side surface 103 and the first side surface 102, as illustrated in FIG. 7B.

The piezoelectric element obtained in this way was subjected to a high temperature and high pressure bias test for the purpose of evaluating its durability. Specifically, under an environment of a temperature of 85° C., and a humidity of 85%, a DC voltage of 60 V was applied and maintained for 200 hours. Then, when the state of the piezoelectric element 108 was checked, no damage or peeling of the insulating film 210 was observed in the piezoelectric element 108, and it was confirmed that the piezoelectric element 108 remained in a normal state.

In each of the above-described examples, all the side surfaces of the piezoelectric layers constituting the piezoelectric film are composed of two surfaces with different inclination angles, but at least one of the plurality of piezoelectric layers may have a configuration in which the side surface is composed of two surfaces having different inclination angles. Further, the step-like shape of the side surface of the piezoelectric film is not limited to the shape of the above-described example, as long as the width in the extending direction (X direction in FIGS. 1A and 1B) of the piezoelectric layer does not decrease or increases monotonically from the upper electrode to the lower electrode. For example, the second side surface 103 may have a flat shape perpendicular to a stacking direction (Z direction) of the piezoelectric layer. The structure of the piezoelectric film 110 in the above example can also be understood as follows. That is, the side surface of the piezoelectric film has a plurality of step portions, and figures obtained by projecting each surface constituting the step portion in the film thickness direction (Z direction) do not overlap with each other. In the comparative example illustrated in FIG. 3, the projection of an umbrella-shaped portion constituting the groove portion 104X in the Z direction overlaps with the projection of another surface, and therefore does not satisfy this condition.

Figure 8B:
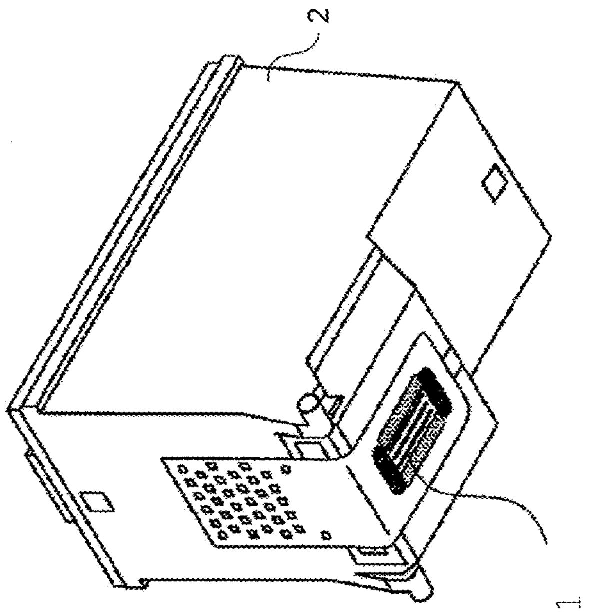
FIGS. 8A and 8B are diagrams illustrating a liquid ejecting device and a liquid ejecting head of an example.
Figure 8A:
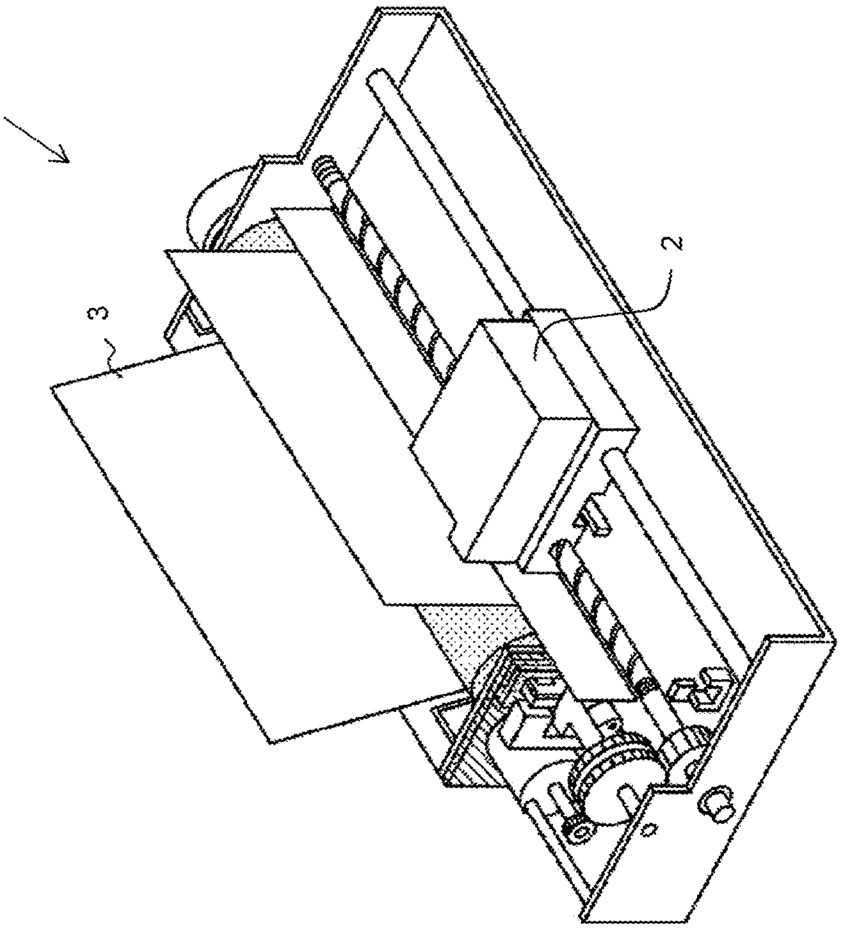

FIGS. 8A and 8B are a schematic drawing illustrating a configuration of main parts of an inkjet printer as a liquid ejection apparatus to which the present disclosure can be applied. FIG. 8A is an overall diagram illustrating an overall configuration of a liquid ejection apparatus 1000. Although a serial type liquid ejection apparatus is shown here as an example, the present disclosure is also applicable to a full line type liquid ejection apparatus. FIG. 8B is a perspective view illustrating a liquid ejection head 2, which is a component of the liquid ejection apparatus 1000.

As illustrated in FIG. 8B, the liquid ejection head 2 includes an element substrate 1 having a plurality of nozzle rows in each of which a plurality of nozzles are arranged. The liquid ejection apparatus 1000 records an image on a medium 3 by ejecting ink droplets from ejection ports (not illustrated) corresponding to the nozzles of the liquid ejection head 2.

Figure 9:
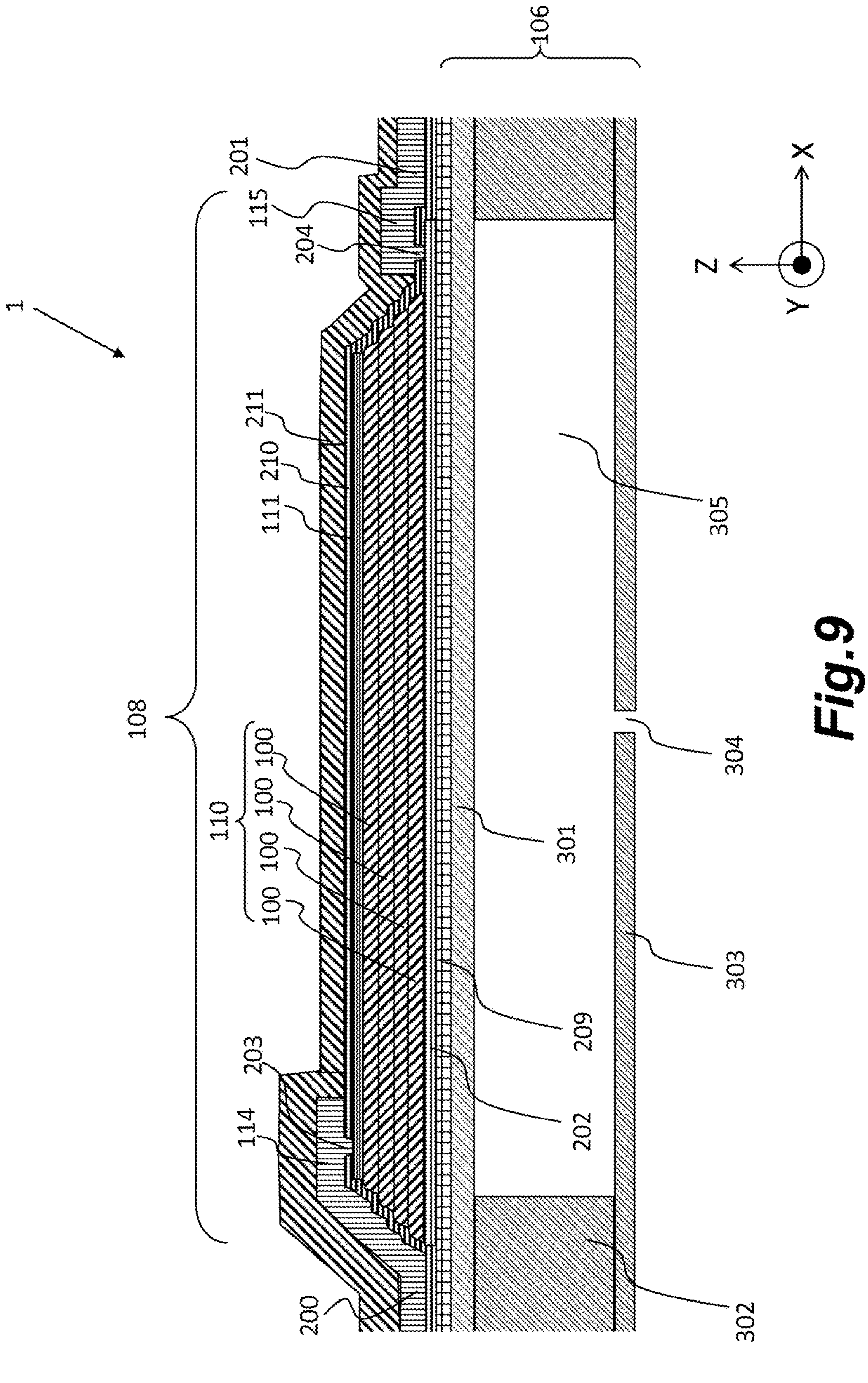
FIG. 9 is a diagram illustrating an element substrate of an example.

FIG. 9 is a diagram illustrating a configuration of main parts of the element substrate 1 of the liquid ejection head 2 of the example. The element substrate 1 has the piezoelectric element 108 of the example described above. The substrate 106 described in the above example includes an insulating film 209, a diaphragm 301, a flow path forming substrate 302, and a nozzle plate 303, and a plurality of nozzle holes 304 are formed in the nozzle plate 303. Liquid ink is ejected from the nozzle hole 304. The flow path forming substrate 302 is provided on the nozzle plate 303, and the flow path forming substrate 302 partitions a space between the nozzle plate 303 and the diaphragm 301, thereby forming a pressure chamber 305. Although not illustrated in FIG. 9 for the sake of simplification, in addition to the pressure chamber 305, various flow paths through which ink flows are formed in the flow path forming substrate 302. Ink is supplied to the ink flow path via a tube from an ink tank provided outside the liquid ejection head 2 and provided inside the liquid ejection apparatus 1000. The piezoelectric element 108 is electrically connected to a drive circuit (not illustrated) and operates based on a signal from the drive circuit. The diaphragm 301 is deformed by the operation of the piezoelectric film 110 and changes an internal pressure of the pressure chamber 305, thereby causing ink to be ejected from the nozzle hole 304.

According to the present disclosure, it is possible to provide a piezoelectric element with excellent coverage of an insulating film covering the piezoelectric element.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-137544, filed on Aug. 25, 2023, which is hereby incorporated by reference herein in its entirety.

What is claimed is:

1. A piezoelectric element comprising:

a substrate having a lower electrode, a piezoelectric film, and an upper electrode, in that order; and an insulating film that covers at least a side surface of the piezoelectric film, wherein one of side surfaces of the piezoelectric film has a plurality of step portions, wherein each of the plurality of step portions has a first side surface and a second side surface, wherein an angle of inclination of the first side surface with respect to an upper surface of the substrate is different from an angle of inclination of the second side surface with respect to the upper surface of the substrate, wherein an angle between the first side surface and the second side surface is 90° or more, wherein figures obtained by projecting each surface constituting the step portion in a film thickness direction do not overlap with each other, and wherein a width of the piezoelectric film in a direction perpendicular to the film thickness direction monotonically increases from the upper electrode to the lower electrode.

2. The piezoelectric element according to claim 1, wherein the first side surface and the second side surface are inclined with respect to the upper surface of the substrate, and the angle of inclination of the second side surface with respect to the upper surface of the substrate is smaller than the angle of inclination of the first side surface with respect to the upper surface of the substrate.

3. The piezoelectric element according to claim 1, wherein the first side surface is inclined with respect to the upper surface of the substrate, and the second side surface is parallel to the upper surface of the substrate.

4. The piezoelectric element according to claim 2, wherein one of the side surfaces of the piezoelectric film has a stepped shape including a step portion with a convex shape formed by the first side surface and the second side surface connected to an upper end of the first side surface, and a step portion with a concave shape formed by the second side surface and the first side surface connected to an upper end of the second side surface.

5. The piezoelectric element according to claim 4, wherein the step portion with the convex shape has a protrusion that protrudes in the film thickness direction of the piezoelectric film.

6. The piezoelectric element according to claim 1, wherein the insulating film further covers a portion of an upper surface of the lower electrode where the piezoelectric film is not formed, a portion of an upper surface of the piezoelectric film where the upper electrode is not formed, and an upper surface of the upper electrode.

7. A liquid ejection head comprising a piezoelectric element, wherein the liquid ejection head eject liquid by driving the piezoelectric element, wherein the piezoelectric element includes:

a substrate having a lower electrode, a piezoelectric film, and an upper electrode, in that order; and an insulating film that covers at least a side surface of the piezoelectric film, wherein one of side surfaces of the piezoelectric film has a plurality of step portions, wherein each of the plurality of step portions has a first side surface and a second side surface, wherein an angle of inclination of the first side surface with respect to an upper surface of the substrate is different from an angle of inclination of the second side surface with respect to the upper surface of the substrate, wherein an angle between the first side surface and the second side surface is 90° or more, wherein figures obtained by projecting each surface constituting the step portion in a film thickness direction do not overlap with each other, and wherein a width of the piezoelectric film in a direction perpendicular to the film thickness direction monotonically increases from the upper electrode to the lower electrode.

8. A method for manufacturing a piezoelectric element, the method comprising the steps of:

forming a lower electrode on an upper surface of a substrate;

forming a piezoelectric film on an upper surface of the lower electrode by forming a piezoelectric layer multiple times using a liquid phase method;

patterning the piezoelectric film by wet etching;

forming a metal film on an upper surface of the piezoelectric film;

forming an upper electrode on the upper surface of the piezoelectric film by patterning the metal film by dry etching;

processing a side surface of the piezoelectric film by dry etching; and forming an insulating film to cover at least the piezoelectric film, wherein the insulating film covers at least a side surface of the piezoelectric film, wherein one of side surfaces of the piezoelectric film has a plurality of step portions, wherein each of the plurality of step portions has a first side surface and a second side surface, wherein an angle of inclination of the first side surface with respect to the upper surface of the substrate is different from an angle of inclination of the second side surface with respect to the upper surface of the substrate, wherein an angle between the first side surface and the second side surface is 90° or more, wherein figures obtained by projecting each surface constituting the step portion in a film thickness direction do not overlap with each other, and wherein a width of the piezoelectric film in a direction perpendicular to the film thickness direction monotonically increases from the upper electrode to the lower electrode.

9. The method according to claim 8, wherein the insulating film is formed by CVD or a combination of ALD and CVD.

10. The method according to claim 8, wherein in the processing step, dry etching is performed for a first processing time.

11. The method according to claim 10, wherein in the processing step, dry etching is performed for a second processing time that is longer than the first processing time, and a step portion with a convex shape among the step portions on one of the side surfaces of the piezoelectric film obtained in the processing step has a protrusion that protrudes in a film thickness direction of the piezoelectric film.

* * * * *